(12) United States Patent
Akiyama et al.

(10) Patent No.: US 10,508,025 B2
(45) Date of Patent: Dec. 17, 2019

(54) MEMS SWITCH AND ELECTRONIC DEVICE

(71) Applicant: TDK CORPORATION, Tokyo (JP)

(72) Inventors: Jotaro Akiyama, Tokyo (JP); Kenji Endou, Tokyo (JP); Takashi Aoyagi, Tokyo (JP); Katsunori Osanai, Tokyo (JP); Tohru Inoue, Tokyo (JP)

(73) Assignee: TDK CORPORATION, Tokyo (JP)

( * ) Notice: Subject to any disclaimer, the term of this patent is extended or adjusted under 35 U.S.C. 154(b) by 531 days.

(21) Appl. No.: 15/255,757

(22) Filed: Sep. 2, 2016

(65) Prior Publication Data

US 2019/0077655 A1    Mar. 14, 2019

(30) Foreign Application Priority Data

Sep. 2, 2015 (JP) ................. 2015-173149
Sep. 2, 2015 (JP) ................. 2015-173151

(51) Int. Cl.
*H01L 41/00*    (2013.01)
*B81B 7/00*    (2006.01)
*B81B 3/00*    (2006.01)
*B81B 7/02*    (2006.01)

(52) U.S. Cl.
CPC .............. *B81B 7/02* (2013.01); *B81B 3/0097* (2013.01); *B81B 7/008* (2013.01); *B81B 2201/014* (2013.01); *B81B 2203/0118* (2013.01); *B81B 2203/04* (2013.01)

(58) Field of Classification Search
CPC ............... H01L 41/0933; H01L 41/094; H01L 41/0946; H01L 41/0953; H01L 41/096; H01L 41/0966; B81B 7/007; B81B 7/008; B81B 3/0021
See application file for complete search history.

(56) References Cited

U.S. PATENT DOCUMENTS

| | | | |
|---|---|---|---|
| 6,784,389 B2 | 8/2004 | Belanger, Jr. et al. | |
| 7,518,474 B1 | 4/2009 | Pulskamp et al. | |
| 8,552,621 B2 | 10/2013 | Piazza et al. | |
| 8,552,624 B2 | 10/2013 | Yamada et al. | |
| 8,604,670 B2 | 12/2013 | Mahameed et al. | |
| 2011/0181150 A1* | 7/2011 | Mahameed | H01H 57/00 310/328 |

* cited by examiner

*Primary Examiner* — Tucker J Wright
*Assistant Examiner* — Scott Stowe
(74) *Attorney, Agent, or Firm* — Oliff PLC

(57) ABSTRACT

A MEMS switch includes a first signal line provided in a first beam, a first GND adjacent to the first signal line, a second signal line provided in a second beam, and a second GND adjacent to the second signal line. A contact terminal is fixed to any one of the first signal line and the second signal line and performs connection between the first signal line and the second signal line according to deformation of the first beam.

9 Claims, 18 Drawing Sheets

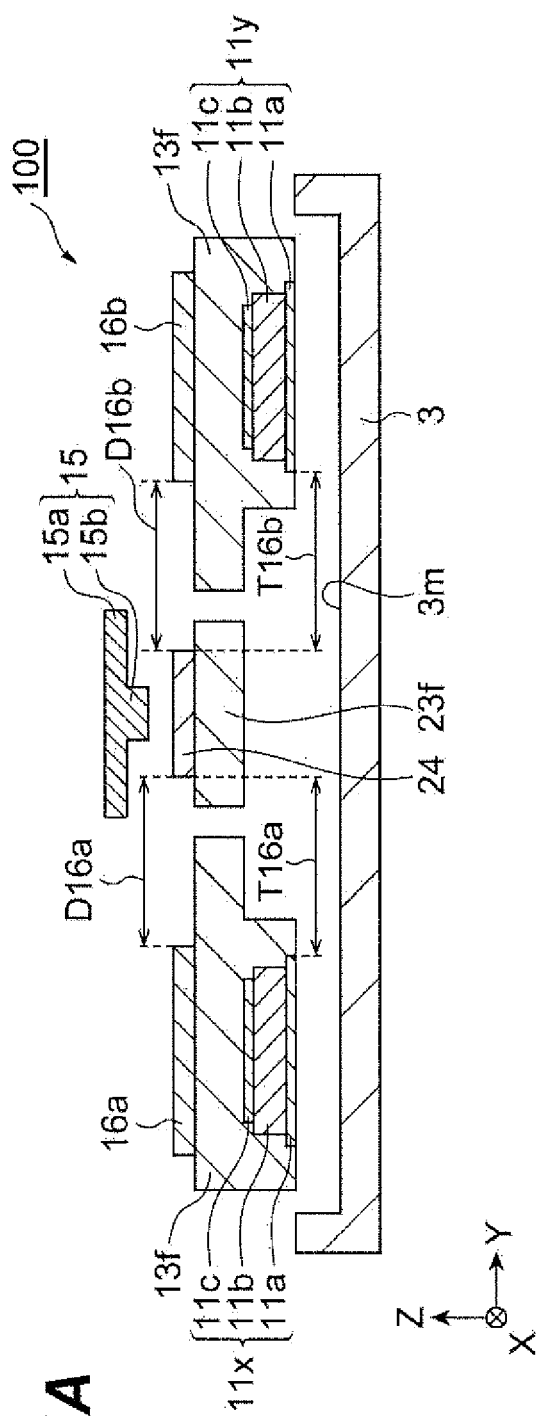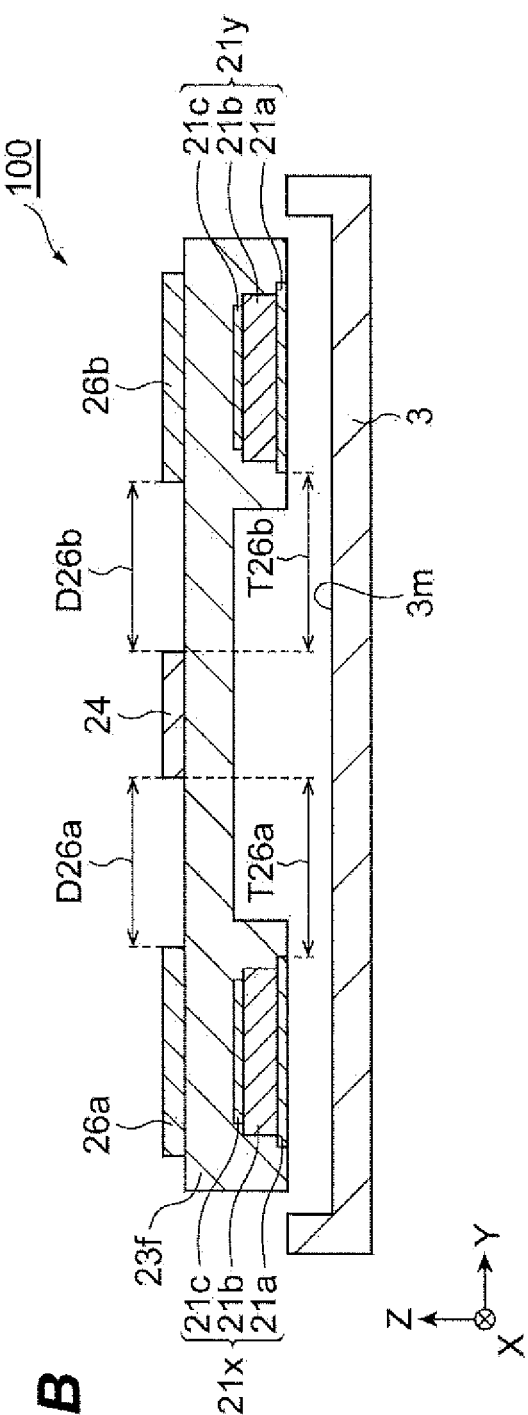

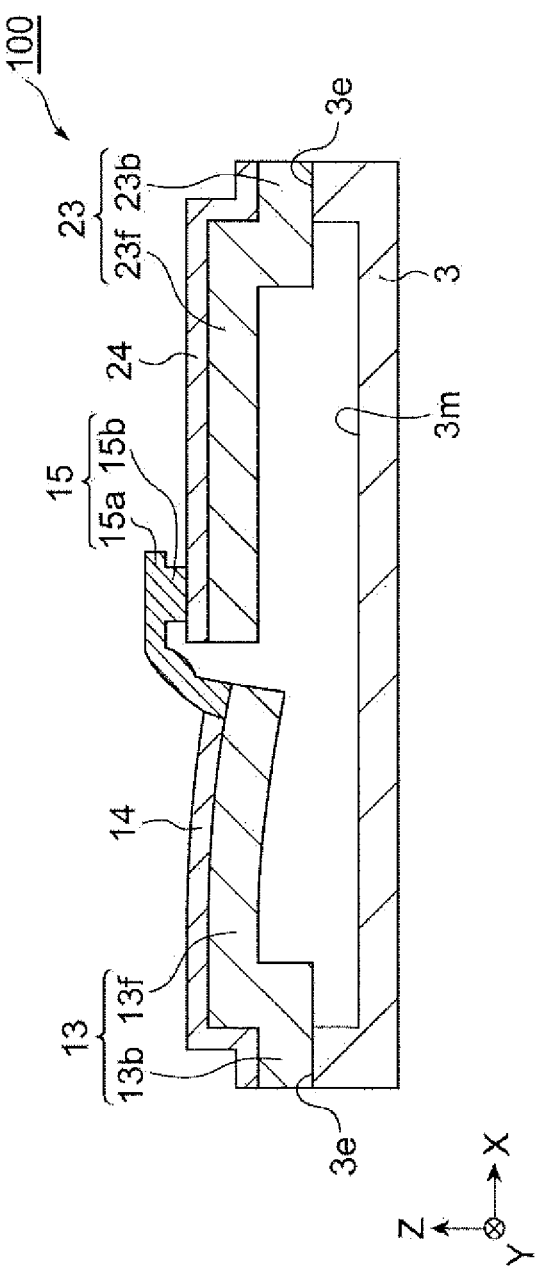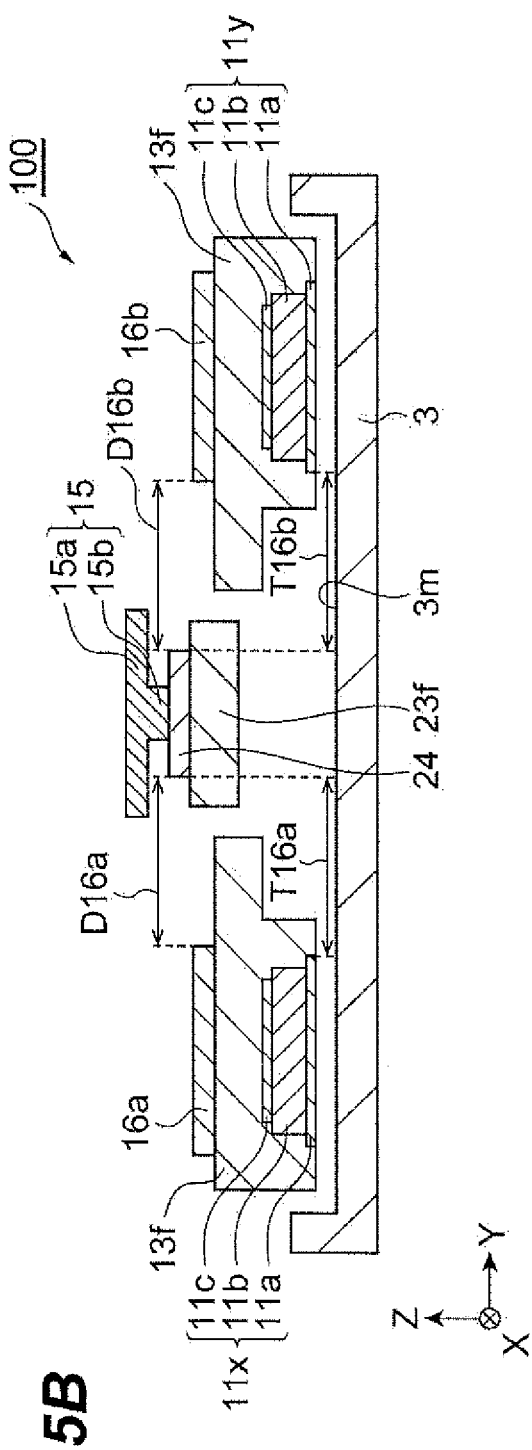

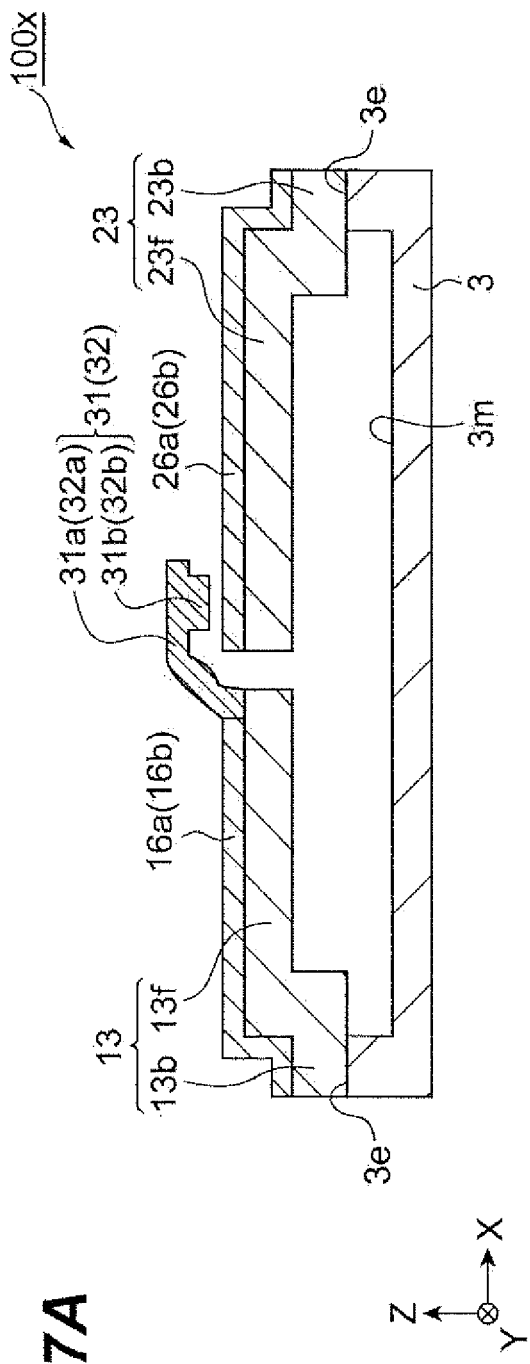
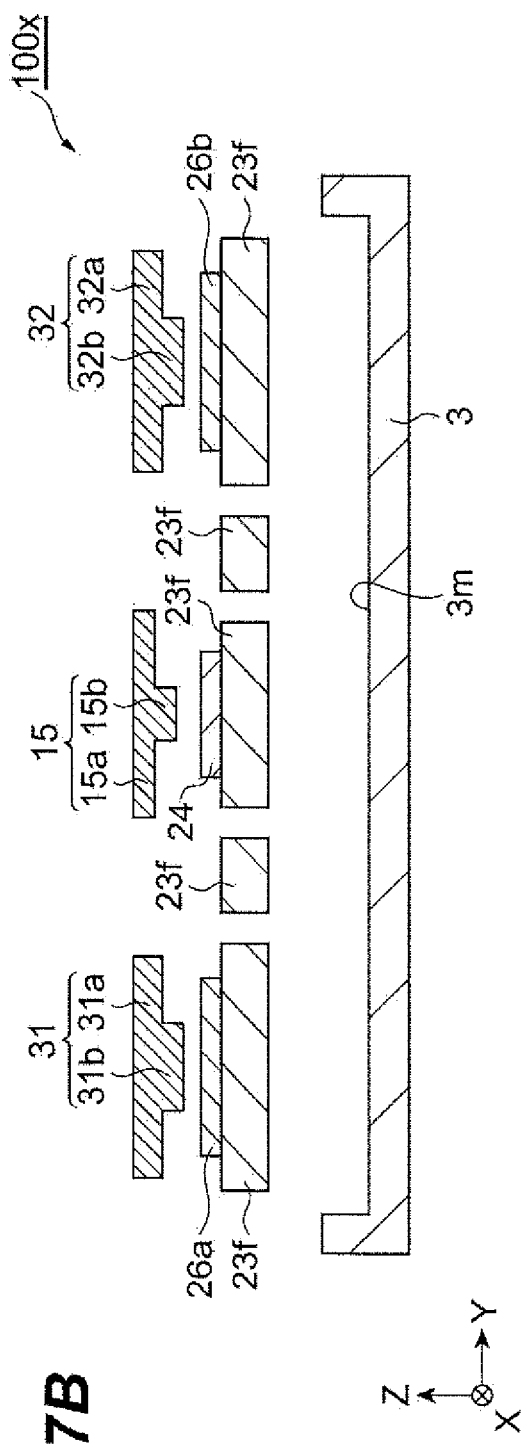
Fig.17A
Fig.17B

MEMS SWITCH AND ELECTRONIC DEVICE

TECHNICAL FIELD

The present invention relates to a MEMS switch and an electronic device.

BACKGROUND

A switching device using a micro electromechanical system (MEMS) is conventionally known. In such a switching device, connection and disconnection between signal lines is performed using a driving element formed of a piezoelectric element or an electrostatic element, a beam formed of a flexible member that is deformed by a driving element, and a contact terminal attached to the beam.

The MEMS switch can be used for connection of a high-frequency signal, such as an RF signal. In a representative component (hereinafter, a movable unit) in which a beam and a driving element are combined, a contact terminal (an electrode) is provided at a tip of the beam. The beam is accommodated in a housing, and an electrode that is a connection destination is provided at a position facing the contact terminal at the tip of the beam in the housing. Due to vibration of the beam, contact (connection) and separation (disconnection) between the electrode of the beam tip and the electrode of the housing are repeated. A MEMS switch for an RF controls transferring an RF signal through such an operation.

The MEMS switch serves as a switch by repeating contact and separation using a small displacement. However, in a movable portion, a position of a contact relative to a housing is likely to be changed due to stress of a film or thermal stress due to a temperature change. A scheme of installing a signal line on a facing movable portion (see U.S. Pat. Nos. 8,552,621 and 8,604,670) has been proposed as a means for avoiding this problem.

SUMMARY

However, although the problem of contact of an RF signal line can be resolved in the scheme disclosed in the patent document, a relative position of an RF signal line and a ground electrode installed near the RF signal line is changed, characteristic impedance is thereby changed, and transmission performance of the RF signal is changed as a result since a variation in warpage due to film stress or thermal stress is allowed. Therefore, a variation between products and deterioration of temperature characteristics occurs.

Further, in the switching device for a high frequency signal, a ground is provided to extend along the signal line, for example, for the purpose of setting characteristic impedance of the signal line. However, the driving element may be deformed due to film stress or thermal stress. Therefore, in a switching device in which a driving element and a first signal line are provided in a flexible member and a ground is provided along the first signal line in a substrate different from the flexible member, if the flexible member (referred to as a composite member including the driving element, a beam, the signal line, and the ground) is deformed due to film stress or thermal stress, a relative positional relationship between the first signal line and the ground is changed. As a result, there is a problem in that characteristic impedance of the first signal line is changed and transmission performance of a high-frequency signal is changed. When such a change occurs, a variation of transmission performance between products or deterioration of temperature characteristics is caused.

In this aspect, a MEMS switch capable of performing high-quality signal transfer and an electronic device using the same are provided. Further, in this aspect, a MEMS switch capable of suppressing a change in characteristic impedance of a signal line and a change in transmission performance of a high-frequency signal due to deformation of the flexible member caused by film stress or thermal stress is provided.

A MEMS switch of a first aspect includes a first flexible member; a first signal line provided in the first flexible member; a first ground electrode provided in the first flexible member and adjacent to the first signal line; a second flexible member adjacent to the first flexible member with a gap; a second signal line provided in the second flexible member; and a second ground electrode provided in the second flexible member and adjacent to the second signal line, and further includes a first driving element that deforms at least the first flexible member; and a contact terminal that is fixed to any one of the first signal line and the second signal line and that performs connection between the first signal line and the second signal line according to the deformation of the first flexible member.

According to this MEMS switch, since the first signal line and the first ground electrode are provided in the same first flexible member, it is possible to suppress a change in the characteristic impedance of the first signal line without changing a relative position even when the first flexible member is displaced by the first driving element. Similarly, since the second signal line and the second ground electrode are provided in the same second flexible member, it is possible to suppress a change in the characteristic impedance of the second signal line without changing a relative position even when the second flexible member is displaced by the second driving element.

Further, since both of the first flexible member and the second flexible member include the signal line and the ground electrode, their physical characteristics easily match. Therefore, it is possible to offset and reduce a change in characteristics of the component or a position of a contact terminal for switching due to a change in temperature. Thus, the MEMS switch can perform high-quality signal transfer by having high resistance against a temperature change and bending.

Further, in the MEMS switch of a second aspect, the first signal line and the first ground electrode are provided on the first flexible member, the second signal line and the second ground electrode are provided on the second flexible member, the second ground electrode extends to be adjacent to the first signal line via a first gap, and the first signal line is located to be interposed between the first ground electrode and the second ground electrode to thereby constitute a first coplanar waveguide, and the first ground electrode extends to be adjacent to the second signal line via a second gap, and the second signal line is located to be interposed between the second ground electrode and the first ground electrode to thereby constitute a second coplanar waveguide.

Further, in the MEMS switch of a third aspect, the first flexible member and the second flexible member are arranged in point symmetry in a plan view.

If the flexible members are arranged in point symmetry, temperature displacement amounts and bending operations of the flexible members are the same since displacement operations thereof are also point-symmetrical to each other. Therefore, it is possible to offset and reduce a variation in a contact position of the contact terminal due to a difference in a temperature change and a bending operation, and to suppress degradation of signal transfer quality.

A MEMS switch of a fourth aspect includes the MEMS switch described above; a signal input element; and a signal processing element connected to the signal input element via the MEMS switch. This electronic device can perform a high-performance operation in which a malfunction is less since the MEMS switch performs high-quality signal transfer.

Further, a piezoelectric MEMS switch of a fifth aspect includes a flexible member including one end portion cantilever-supported by a substrate, and a separation portion thereby separated from the substrate; a first signal line provided in the flexible member; a second signal line provided to be separated from the first signal line; a first pair of grounds provided in the flexible member; a piezoelectric driving element for deforming the flexible member; and a contact terminal that is provided in the flexible member and that switches between electrical connection and disconnection between the first signal line and the second signal line due to deformation of the flexible member by the piezoelectric driving element, wherein the first pair of grounds are provided so that the first pair of grounds are separated from the first signal line in the separation portion of the flexible member and the first signal line is interposed therebetween in a plan view, and at least a portion of the piezoelectric driving element overlaps the first pair of grounds in the separation portion of the flexible member in the plan view.

In this piezoelectric MEMS switch, the first signal line and the first pair of grounds are both provided in the separation portion of the flexible member. Therefore, even when the flexible member at least partially overlapping the first pair of grounds in the plan view is deformed due to film stress or thermal stress, a relative positional relationship between the first signal line and the first pair of grounds is hardly changed or is not changed at all. Thus, according to the piezoelectric MEMS switch, it is possible to suppress a change in characteristic impedance of the first signal line and a change in transmission performance of a high-frequency signal due to deformation of the flexible member caused by film stress or thermal stress.

Further, in the piezoelectric MEMS switch according to a sixth aspect, it is preferable for the first signal line not to overlap the piezoelectric driving element in the separation portion of the flexible member in the plan view. If the first signal line overlaps the piezoelectric driving elements in the plan view, electrode portions of the piezoelectric driving elements having a potential that is not a floating potential exist under the first signal line. If such electrode portions exist, transmission loss of a high frequency signal passing through the first signal line increases. Therefore, it is possible to suppress an increase in transmission loss due to the electrode portions of the piezoelectric driving elements by using the above-described configuration.

Further, in the piezoelectric MEMS switch according to a seventh aspect, it is preferable for a distance from each of the pair of grounds to the first signal line to be shorter than a distance from the first signal line to the piezoelectric driving element in the separation portion of the flexible member. When the first signal line is near the piezoelectric driving element, the electrode of the piezoelectric driving element is electrically coupled to the first signal line, and it is easy for characteristic impedance to be shifted from a predetermined value. Accordingly, transmission loss of a high frequency signal passing through the first signal line increases. Therefore, with the configuration described above, since the pair of grounds are closer to the first signal lines than they are to the piezoelectric driving elements, it is possible to suppress the increase in transmission loss based on the reason described above.

Further, it is preferable for a piezoelectric MEMS switch according to an eighth aspect to further include: a second pair of grounds provided so that the second pair of grounds are separated from the second signal line and the second signal line is interposed therebetween in the plan view; and a pair of contact terminals for ground that switch between electrical connection and disconnection between one of the first pair of grounds and one of the second pair of grounds and between the other of the first pair of grounds and the other of the second pair of grounds due to deformation of the flexible member by the piezoelectric driving element when a contact terminal for a signal line switches between the electrical connection and the disconnection between the first signal line and the second signal line due to deformation of the flexible member by the piezoelectric driving element.

Thus, if the first signal line is connected to the second signal line by the contact terminal for a signal line, the first pair of grounds for the first signal line and the second pair of grounds for the second signal line are electrically connected to each other by the contact terminal for ground near a connection point of the first signal line and the second signal line, and have the same potential. Therefore, it is possible to stabilize a function of setting characteristic impedance of the first and the second pair of grounds near the connection point of the first signal line and the second signal line.

Further, in a piezoelectric MEMS switch according to a ninth aspect, it is preferable for the first signal line and the first pair of grounds to be provided at substantially the same vertical position. Accordingly, since the first signal line is interposed in substantially the same plane between the first pair of grounds, the first pair of grounds can stabilize a function of setting impedance as a coplanar line.

Further, a MEMS switch according to a tenth aspect includes: a flexible member including one end portion cantilever-supported by a substrate, and a separation portion thereby separated from the substrate; a first signal line provided in the flexible member; a second signal line provided to be separated from the first signal line; a first pair of grounds provided in the flexible member; a driving element for deforming the flexible member; a contact terminal for a signal line that is provided in the flexible member and that switches between electrical connection and disconnection between the first signal line and the second signal line due to deformation of the flexible member by the driving element; a second pair of grounds provided so that the second pair of grounds are separated from the second signal line and the second signal line is interposed therebetween in a plan view; and a pair of contact terminals for grounding that switch between electrical connection and disconnection between one of the first pair of grounds and one of the second pair of grounds and between the other of the first pair of grounds and the other of the second pair of grounds due to deformation of the flexible member by the driving element when the contact terminal switches between the electrical connection and the disconnection between the first signal line and the second signal line due to deformation of the flexible member by the driving element, wherein the first pair of grounds are provided so that the first pair of grounds are separated from the first signal line in the separation portion of the flexible member and the first signal line is interposed therebetween in the plan view, at least a portion of the driving element overlaps the first pair of grounds in the separation portion of the flexible member in the plan view, and a timing at which the pair of contact terminals for grounding performs switching from an electrical disconnection state to a connection state between one of the first pair of grounds and one of the second pair of grounds and between the other of the first pair of grounds and the other of the second pair of grounds due to deformation of the flexible member by the driving element is earlier than a timing at which the pair of contact terminals for a signal line performs switching from an electrical disconnection state to a connection state between the first signal line and the second signal line due to deformation of the flexible member by the driving element.

In this MEMS switch, the first signal line and the first pair of grounds are both provided in the separation portion of the flexible member. Therefore, even when the flexible member at least partially overlapping the first pair of grounds in the plan view is deformed due to film stress or thermal stress, a relative positional relationship between the first signal line and the first pair of grounds is hardly changed or is not changed at all. Thus, according to the piezoelectric MEMS switch of the present invention, it is possible to suppress a change in characteristic impedance of the first signal line and a change in transmission performance of a high-frequency signal due to deformation of the flexible member caused by film stress or thermal stress.

Further, in the above-described MEMS switch, if the first signal line is connected to the second signal line by the contact terminal for a signal line, the first pair of grounds for the first signal line and the second pair of grounds for the second signal line are electrically connected to each other by the contact terminal for grounding near a connection point of the first signal line and the second signal line, and have the same potential. Therefore, it is possible to stabilize a function of setting characteristic impedance of the first and the second pair of grounds near the connection point of the first signal line and the second signal line.

In the above-described MEMS switch, when the first signal line and the second signal line are switched from the electrical disconnection state to the connection state, the first pair of grounds are electrically connected to the second pair of grounds before the first signal line is electrically connected to the second signal line. Thus, the first signal line can be electrically connected to the second signal line after the function of setting characteristic impedance of the first and second pairs of grounds is stabilized.

According to the MEMS switch of the above-described aspect, it is possible to perform high-quality signal transfer. Further, it is possible to provide a MEMS switch capable of suppressing a change in characteristic impedance of the signal line and a change in transmission performance of a high-frequency signal due to deformation of the flexible member caused by film stress or thermal stress.

BRIEF DESCRIPTION OF THE DRAWINGS

FIG. 14A is an end view of the MEMS switch along line A-A in FIG. 12
FIG. 14B is an end view of the MEMS switch taken along line B-B in FIG. 12.
FIG. 15A is an end view of the MEMS switch that is in a state in which a first signal line is electrically connected to a second signal line, and corresponds to an end face of the MEMS switch taken along the line C-C in FIG. 12,
and FIG. 15B is an end view of the MEMS switch that is in a state in which the first signal line is electrically connected to the second signal line, and corresponds to an end face of the MEMS switch taken along the line A-A in FIG. 12.
FIG. 17A is an end view of the MEMS switch taken along line A-A of FIG. 16,
and FIG. 17B is an end view of the MEMS switch taken along line B-B of FIG. 16.

DETAILED DESCRIPTION

Figure 1:
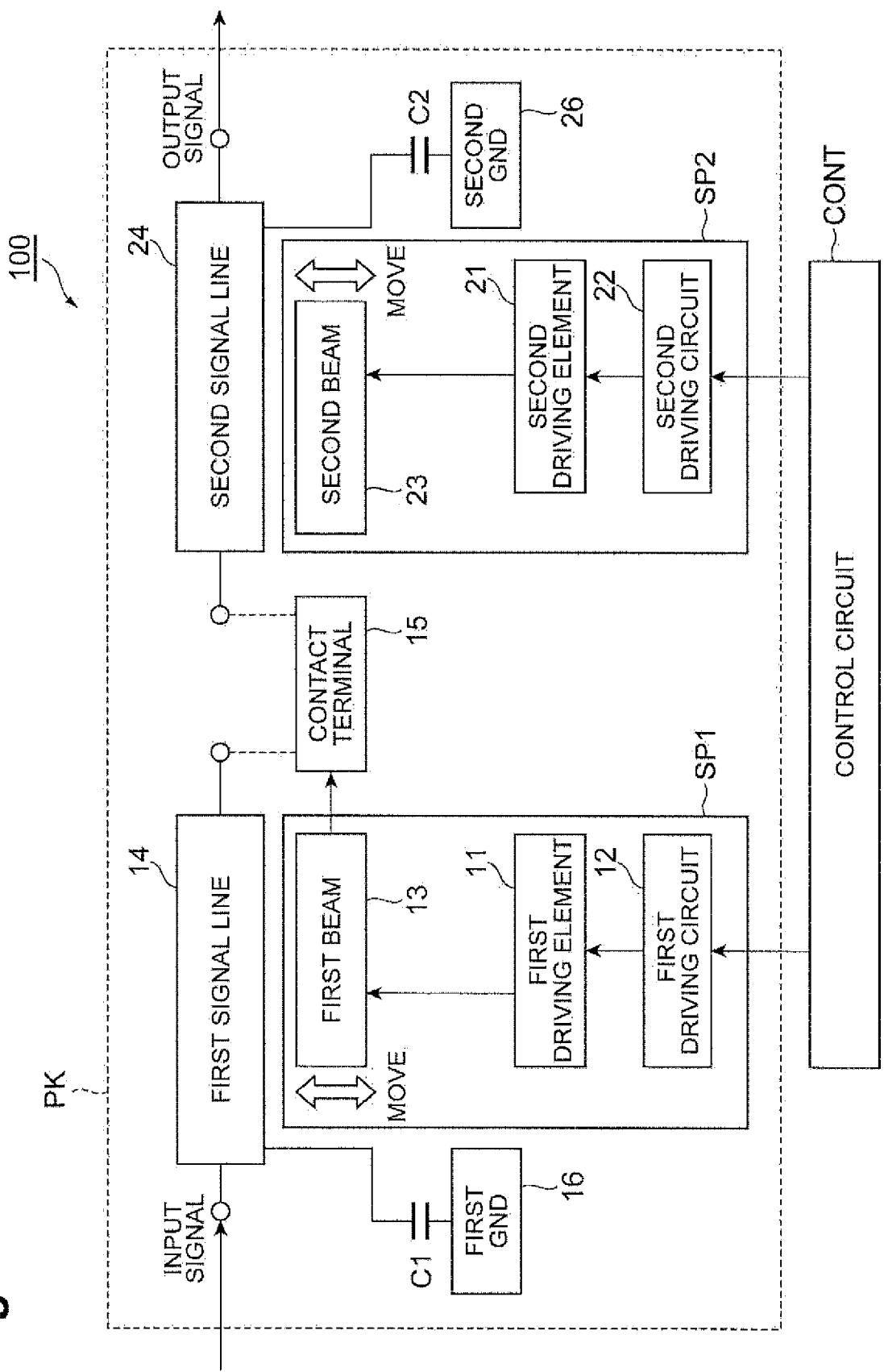
FIG. 1 is a block diagram illustrating a schematic configuration of a MEMS switch.

Hereinafter, embodiments of the present invention will be described in detail with reference to the accompanying drawings. The same elements are denoted with the same reference numerals in descriptions of the drawings, and repeated descriptions thereof will be omitted.

FIG. 1 is a diagram illustrating a schematic configuration of a MEMS switch 100.

The MEMS switch 100 is one so-called high-frequency switch (an RF switch) and is a device which mechanically performs switching using a piezoelectric or electrostatic actuator or the like.

As illustrated in FIG. 1, the MEMS switch 100 includes a first driving unit SP1, a first signal line 14, a contact terminal 15, a first ground (a first GND) 16, a second driving unit SP2, a second signal line 24, and a second ground (a second GND) 26. The first driving unit SP1 includes a first driving element 11 (for example, a piezoelectric driving element), a first driving circuit 12, and a first beam 13. Further, the second driving unit SP2 includes a second driving element (for example, piezoelectric driving element) 21, a second driving circuit 22, and a second beam 23. Further, the above-described elements constituting the MEMS switch 100 is in a state in which the elements are covered with, for example, a fixing member PK such as housing.

Each of the first signal line 14 and the second signal line 24 is formed of a conductor such as Cu. Further, the contact terminal 15 is formed of a conductor such as Au. In the MEMS switch 100, an input signal from the outside is guided via the first signal line 14 and the second signal line 24, and is output as an output signal from the second signal line 24 to the outside. Connection and disconnection between the first signal line 14 and the second signal line 24 are switched by the contact terminal 15.

When the contact terminal 15 is fixed to the first signal line 14, the contact terminal 15 comes into contact with the second signal line 24 such that the first signal line 14 is electrically connected to the second signal line 24 (ON), and the contact terminal 15 is separated from the second signal line 24 such that the first signal line 14 is electrically disconnected from the second signal line 24 (OFF). The contact terminal 15 may be fixed to the second signal line 24 rather than the first signal line 14.

When a configuration in which the contact terminal 15 is separated from both the first signal line 14 and the second signal line 24, the contact terminal 15 comes into contact with both the first signal line 14 and the second signal line 24 due to a movement of the contact terminal 15 such that the first signal line 14 is electrically connected to the second signal line 24 (ON), and the contact terminal 15 is separated from the first signal line 14 and the second signal line 24 such that the first signal line 14 is electrically disconnected from the second signal line 24 (OFF).

The first signal line 14 and the first GND 16 are arranged to be near each other so that an electromagnetic influence occurs, a capacitance C1 is interposed between the first signal line 14 and the first GND 16, and a high-frequency line having predetermined characteristic impedance is formed. Further, the second signal line 24 and the second GND 26 are arranged to be near each other so that an electromagnetic influence occurs, a capacitance C2 is interposed between the second signal line 24 and the second GND 26, and a high-frequency line for a high frequency having predetermined characteristic impedance is formed. It is preferable that the first GND 16 and the second GND 26 are electrically connected to each other and fixed to the same potential. The grounds constitute a high-frequency line having predetermined characteristic impedance, such as a coplanar waveguide (CPW) or a line, together with the first signal line 14 and the second signal line 24. The capacitance C1 is interposed between the first signal line 14 and the first GND 16, and the capacitance C2 is interposed between the second signal line 24 and the second GND 26.

Switching connection and disconnection between the first signal line 14 and the second signal line 24 using the contact terminal 15 is performed by physical movement of some of the first signal line 14, the contact terminal 15, and the second signal line 24. The first driving unit SP1 has a function of deforming the first beam 13 using the first driving element 11 to move both the contact terminal 15 and the first signal line 14 when the contact terminal 15 is fixed to the first signal line 14, and to move the contact terminal 15 when the contact terminal 15 is not fixed to the first signal line 14.

Since the second driving unit SP2 can deform the second beam 23 using the second driving element 21, the second signal line 24 fixed to the second beam 23 can be moved toward the contact terminal 15 or can be separated if necessary. When deformation of the second beam 23 is unnecessary, a drive signal is not applied from the second driving circuit 22 to the second driving element 21, and when the deformation of the second beam 23 is not required, the second driving circuit 22 may be omitted.

In the first driving unit SP1, the first driving element 11 is deformed due to an application of voltage from the first driving circuit 12 on the basis of the signal from the control circuit CONT. The first beam 13 (the first flexible member 13) is formed of a member having flexibility and is deformed with the deformation of the first driving element 11.

Similarly, in the second driving unit SP2, the second driving element 21 is deformed due to an application of voltage from the second driving circuit 22 on the basis of the signal from the control circuit CONT. The second beam 23 (the second flexible member 23) is formed of a member having flexibility and is deformed with the deformation of the second driving element 21.

Figure 2:
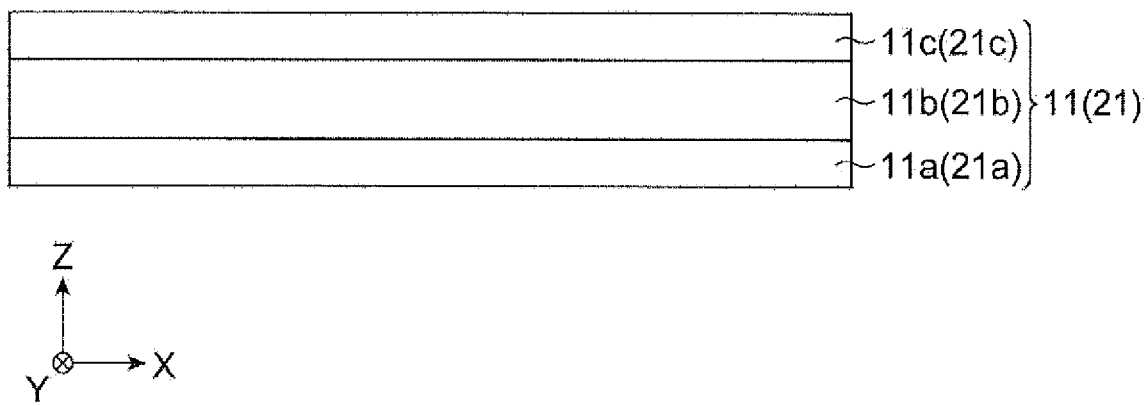
FIG. 2 is a schematic sectional view illustrating a configuration of a piezoelectric driving element.

FIG. 2 is a schematic sectional view illustrating a configuration of a piezoelectric driving element when the first driving element 11 and the second driving element 21 are piezoelectric driving elements.

Hereinafter, an XYZ three-dimensional Cartesian coordinate system is set. A thickness direction of the first beam 13 illustrated in FIG. 1 is a Z-axis direction, a longitudinal direction thereof is an X-axis direction, and a width direction perpendicular to both the Z-axis and the X-axis is a Y-axis direction.

As illustrated in FIG. 2, the first driving element 11 of the first driving unit SP1 has a configuration in which a lower electrode layer 11$a$ of Pt or the like, a piezoelectric material layer 11$b$, and an upper electrode layer 11$c$ of Pt or the like are laminated and arranged in the Z direction. By applying a predetermined voltage between the lower electrode layer 11$a$ and the upper electrode layer 11$c$ of the first driving element 11, a thickness of the piezoelectric material layer 11$b$ is increased and an in-plane dimension is decreased (the piezoelectric material layer 11$b$ shrinks in an in-plane direction) or the thickness of the piezoelectric substance 11$b$ is decreased and the in-plane dimension is increased. When a positive DC voltage is applied in the same direction as polarization of the piezoelectric body, a piezoelectric element expands, and conversely when a negative DC voltage is applied, the piezoelectric element contracts. Thus, the expansion and contraction in the in-plane direction of the piezoelectric element can be controlled by controlling the direction of the voltage.

A material when the first driving element 11 is a piezoelectric element will be additionally descried.

A material having a great electromechanical coupling coefficient, a small propagation loss, a small power flow angle, and a small delay time temperature coefficient is preferred as a material of the piezoelectric body. For example, lead zirconate titanate (PZT), barium titanate (BaTiO$_3$), or the like is preferred. A conventional known film formation method can be appropriately used to form each layer. For example, a deposition method, a sputtering method, a chemical vapor deposition (CVD) method, a plasma-assisted vapor deposition (PCVD) method, or plating can be used. As another material of the piezoelectric body, potassium sodium niobate (KNN), potassium niobate (KNbO$_3$), bismuth sodium titanate (BNT), aluminum nitride (AlN), zinc oxide (ZnO), bismuth iron oxide (for example, BiFeO$_3$), lead titanate (PbTiO$_3$), lithium niobate (LiNbO$_3$), lithium tantalate (LiTaO$_3$), or the like can be used.

A dimension of the first driving element 11 will be described.

A dimension in the X-axis direction of the first driving element 11 is 200 µm (50 to 500 µm), a dimension in the Y-axis direction is 250 µm (50 to 500 µm), and a dimension in the Z-axis direction is 2 µm (0.3 to 3 µm). The values in parentheses indicate a preferred range. In this case, there is an effect that a morphological balance of the first driving element 11 makes it easy to control a small displacement (sub-micron to a few microns) of the driving element which is required for a miniaturized piezoelectric MEMS switch.

The second driving element 21 of the second driving unit SP2 includes a lower electrode layer 21a, a piezoelectric material layer 21b, and an upper electrode layer 21c, similar to the first driving element 11. Further, a structure, a material, and an effect of the second driving element 21 are the same as those of the first driving element 11. Further, since a shape in an XY plane of the second driving element 21 is the same as the shape in the XY plane of the second beam 23, and the shapes are fixed, the second beam 23 is deformed according to the deformation of the second driving element 21.

Figure 3:
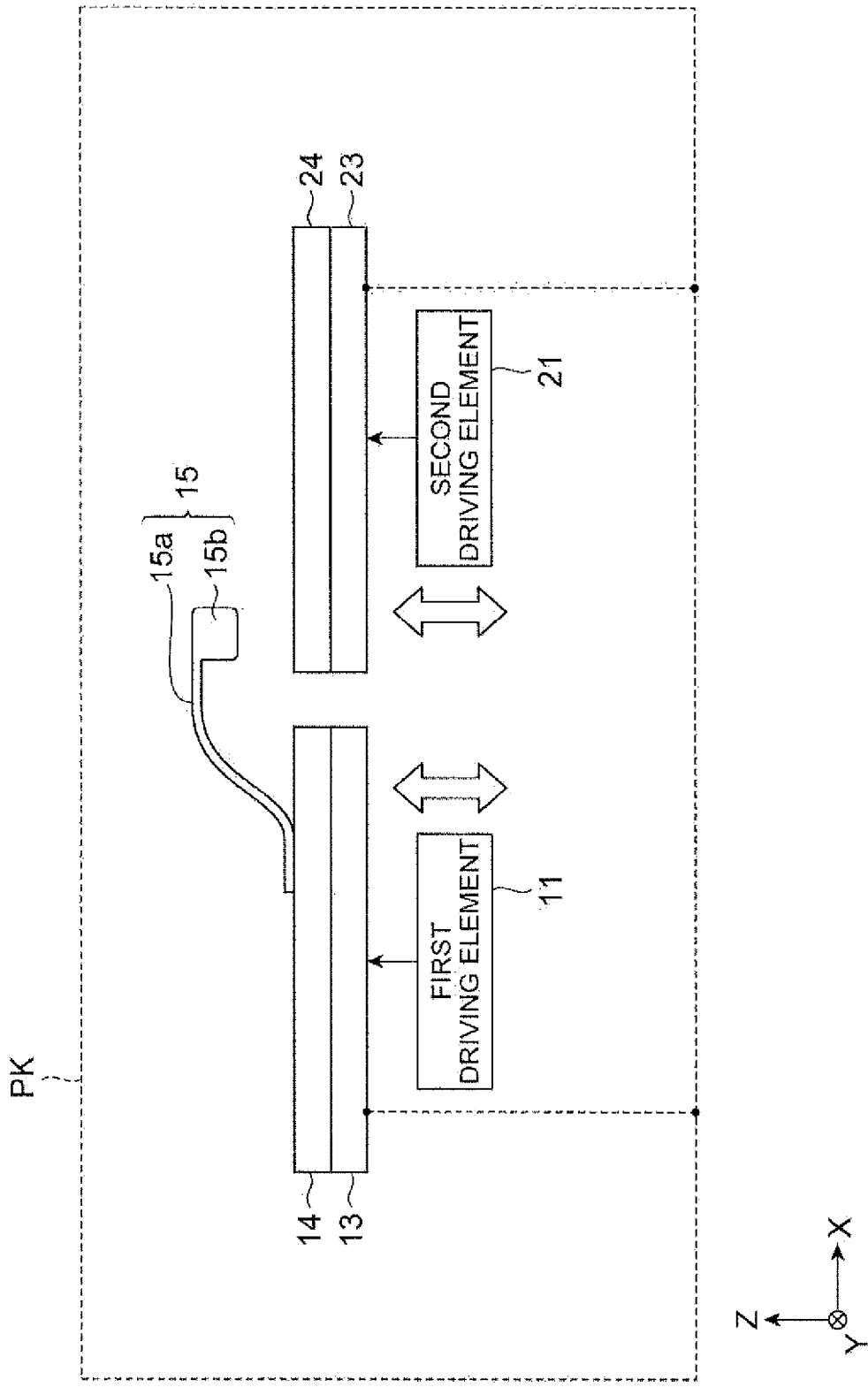
FIG. 3 is a schematic sectional view illustrating a function of a contact member in the MEMS switch.

FIG. 3 is a schematic structural diagram illustrating a structure around the first beam 13 and the second beam 23.

In the MEMS switch 100 according to this embodiment, the first beam 13 and the second beam 23 are plate-like flexible members extending in the X-axis direction, a longitudinal direction thereof is aligned in the X-axis direction, and the beams are arranged in the same XY plane. One end in a −X direction of the first beam 13 and one end in a +X direction of the second beam 23 are fixed to the fixing member PK, and tip portions of the first beam 13 and the second beam 23 facing each other are free ends. That is, the first beam 13 and the second beam 23 have a so-called cantilever structure.

The first signal line 14 is attached to the first beam 13, and the second signal line 24 is attached to the second beam 23. The first signal line 14 and the second signal line 24 are arranged in extending directions (the X-axis direction) of the first beam 13 and the second beam 23, respectively. Further, the contact terminal 15 is attached to an end portion on the free end of the first beam 13. The contact terminal 15 is connected to the first signal line 14. The contact terminal 15 includes a body portion 15a (a contact terminal body) connected to the first beam 13, and a contact portion 15b projecting from the body portion 15a. The contact portion 15b is provided at a position facing the second signal line 24 in the body portion 15a. The contact terminal 15 is formed of a conductor, is provided in an end portion on a side opposite to the end portion on a side connected to the first signal line 14 in the body portion 15a in a state in which the first driving element 11 and the second driving element 21 are not driven, and is arranged in a state in which the contact portion 15b projecting toward the second signal line 24 is separated from the second signal line 24. The contact portion 15b of the contact terminal 15 may be the same material as the body portion 15a of the contact terminal 15 or may be a material different from the body portion 15a.

Since the first driving element 11 is fixed to the first beam 13, the first beam 13 is deformed according to deformation of the first driving element 11. Further, since the second driving element 21 is fixed to the second beam 23, the second beam 23 is deformed according to deformation of the second driving element 21.

If the first driving element 11 is deformed in conjunction with a voltage due to an application of the voltage to the first driving element 11, the first beam 13 is deformed and the contact portion 15b is moved, for example, downward. Similarly, if the second driving element 21 is deformed in conjunction with a voltage due to an application of the voltage to the second driving element 21, if necessary, the second beam 23 is deformed. The contact portion 15b comes into contact with the second signal line 24 on the second beam due to the deformation of the first beam 13 and/or the deformation of the second beam 23 by the second driving element 21. Thus, the first signal line 14 is electrically connected to the second signal line 24 via the contact terminal 15. If driving voltages in opposite directions are applied to the first driving element 11 and the second driving element 21, the first driving element 11 and the second driving element 21 are bent and moved in opposite directions. Accordingly, it is possible to decrease a stroke necessary for contact in each element.

Configurations of the first driving unit SP1 and the second driving unit SP2 are not particularly limited as long as switching connection and disconnection between the first signal line 14 and the second signal line 24 by the contact terminal 15 can be performed. For example, a configuration in which one of the first driving unit SP1 and the second driving unit SP2 does not include the driving circuit and the beam is not moved by piezoelectric driving of the driving element (that is, the beam is fixed to the fixing member PK) may be adopted. In this case, it is possible to realize switching connection and disconnection between the first signal line 14 and the second signal line 24 by the contact terminal 15 by changing a positional relationship among the first signal line 14, the second signal line 24, and the contact terminal 15 due to the deformation of the beam on the one side.

Materials of the first beam 13 and the second beam 23 will be additionally described.

Although a material of the first beam 13 and the second beam 23 is not particularly limited, a material exhibiting linearity in a distortion stress curve, that is, a material having elasticity, is preferable. For example, an intermetallic compound such as an Fe—Ni—Cr alloy or a Cu—Sn—P alloy, a single crystal Si, or the like may be appropriately used. Among them, the single crystal Si may be particularly suitably used since the single crystal Si has a wide linear region in a distortion stress curve. Although the material of the first beam 13 and the second beam 23 may be appropriately selected from materials having flexibility as described above, SiNx (silicon nitride), $Al_2O_3$ (alumina), TiNx (titanium nitride), $SiO_2$ (silicon oxide), AlN (aluminum nitride), polycrystalline Si, amorphous silicon, diamond, DLC (diamond-like carbon), or the like may be used in addition to the above materials.

Dimensions of the first beam 13 and the second beam 23 will be described.

A dimension in the X-axis direction of the first beam 13 is 250 µm (50 µm to 500 µm), a dimension in the Y-axis direction is 250 µm (50 µm to 500 µm), and a dimension in the Z-axis direction is 3 µm (0.5 µm to 5 µm). The values of the parentheses indicate a preferred range. In this case, there is an effect that a morphological balance of the first beam 13 makes it easy to control a small displacement (sub-micron to a few microns) of the beam which is required for a miniaturized piezoelectric MEMS switch. Further, a shape in the XY plane of the first beam 13 is a generally rectangular shape with respect to a deflectable movable region (region on the tip side relative to a portion fixed to the fixing member PK) but, for example, a semi-circle, a forked shape, or a triangle may be considered as a shape of the movable region.

Figure 4:
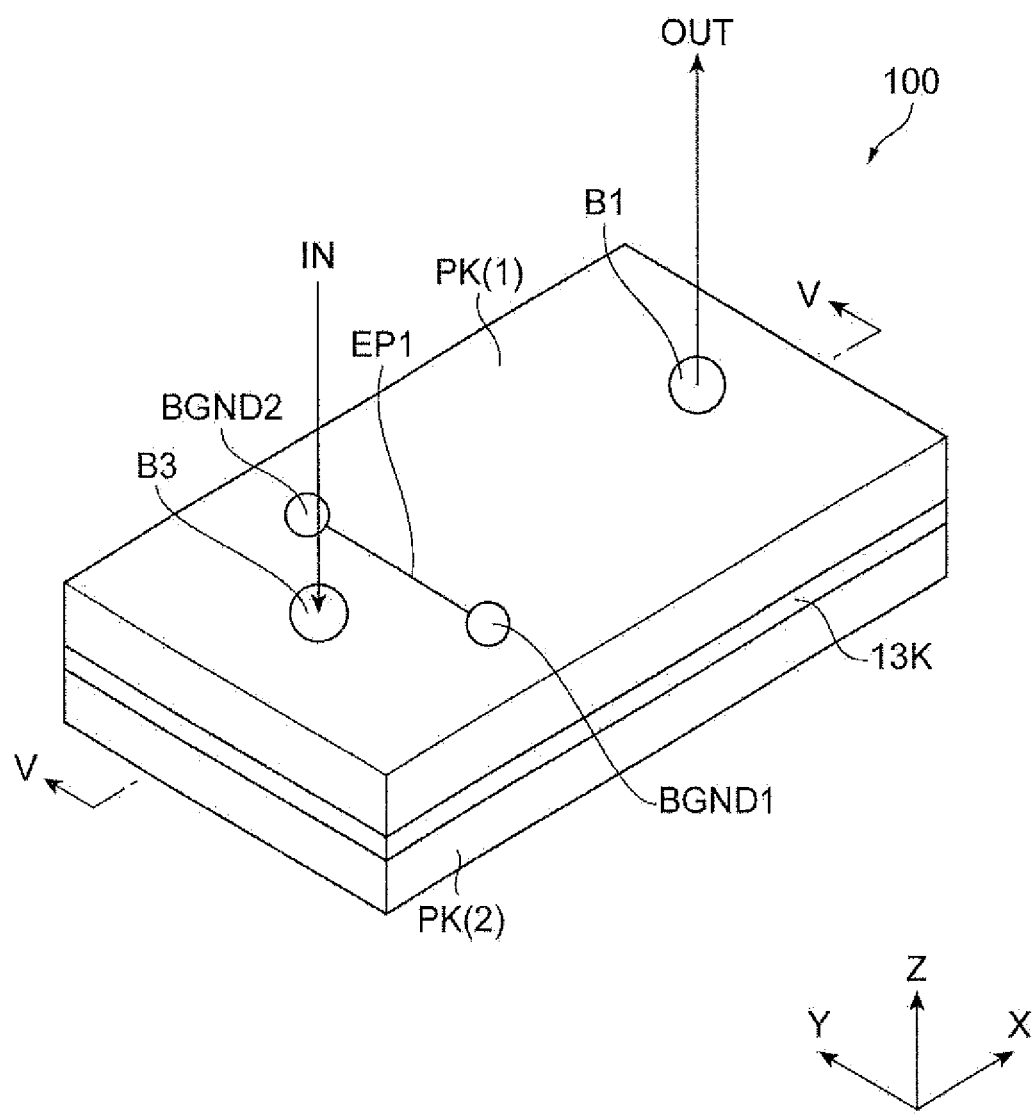
FIG. 4 is a perspective view of a MEMS switch according to a first embodiment.

FIG. 4 is a perspective view of a MEMS switch of the first embodiment.

The above-described fixing member PK is a housing package including a first member PK(1) and a second member PK(2) having opposed recesses. The beam 13 and the beam 23 described above are portions of a substrate 13K including the beams, and a region around the substrate 13K is interposed between the first member PK(1) and the second member PK(2).

If an input signal IN is input to the MEMS switch 100 via an electrode pad B3 on the input side, an output signal OUT is output from an electrode pad B1 on the output side when the first signal line and the second signal line are connected by an internal contact terminal. When the first signal line is disconnected from the second signal line according to the position of the contact terminal inside the MEMS switch 100, the input signal IN is not output from the electrode pad B1 on the output side.

A first electrode pad BGND1 electrically connected to the above-described first GND 16 and a second electrode pad BGND2 electrically connected to the second GND 26 are electrically connected to each other by an electrode pattern EP1 for connection, and the ground electrodes are set to the same potential. Although the electrode pattern EP1 for connection is provided on an outer surface of the package, the electrode pattern EP1 may be provided inside the package.

Figure 5:
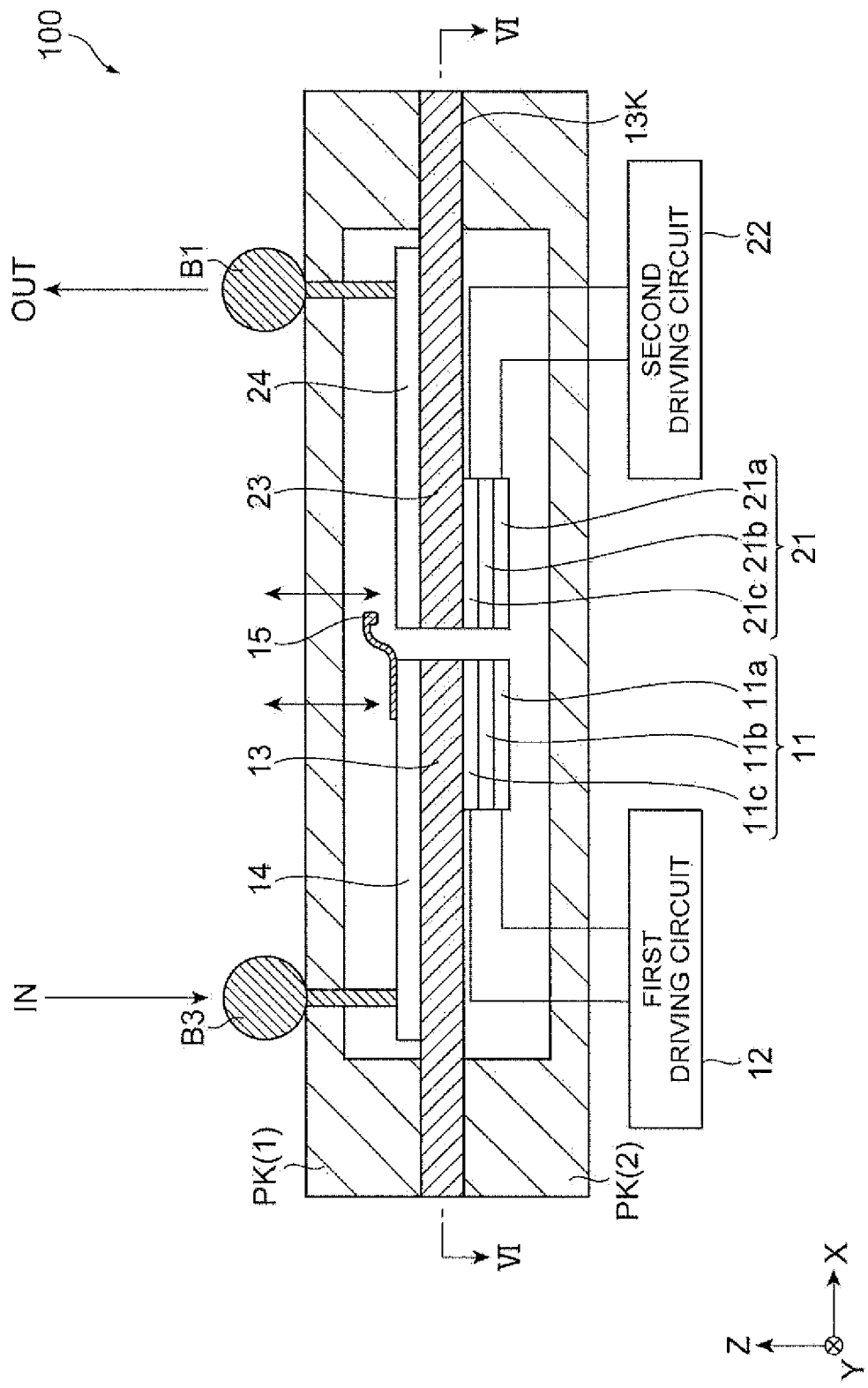
FIG. 5 is a diagram illustrating a longitudinal sectional configuration of the MEMS switch illustrated in FIG. 4.

FIG. 5 is a diagram illustrating a longitudinal sectional configuration (a section taken along arrow V-V) of the MEMS switch illustrated in FIG. 4.

The first driving element 11 is fixed to a lower surface of the first beam 13, and the second driving element 21 is fixed to a lower surface of the second beam 23.

A driving voltage is applied to the first driving element 11 by the first driving circuit 12. Specifically, a predetermined voltage is applied between the lower electrode layer 11a and the upper electrode layer 11c of the first driving element 11. The contact terminal 15 is fixed to and electrically connected to the first signal line 14. When the first beam 13 is bent in an XZ plane due to an application of a predetermined voltage, the contact terminal 15 is moved in a vertical direction, the contact terminal 15 comes into contact with the second signal line 24, and the first signal line 14 is electrically connected to the second signal line 24.

The upper electrode layer 11c of the first driving element 11 is electrically connected to a bump or an electrode pad (not illustrated) via a through hole provided in the first member PK(1).

A driving voltage may be applied to the second driving element 21 by the second driving circuit 22. Specifically, a predetermined voltage may be applied between the lower electrode layer 21a and the upper electrode layer 21c of the second driving element 21. When the second beam 23 is bent in the XZ plane due to an application of the predetermined voltage and a tip portion of the second signal line 24 is moved in a direction of the contact terminal 15, the contact terminal 15 and the second signal line 24 come into contact with each other, and the first signal line 14 is electrically connected to the second signal line 24.

The upper electrode layer 21c of the second driving element 21 is electrically connected to the bump or the electrode pad (not illustrated) via the through hole provided in the first member PK(1).

Figure 6:
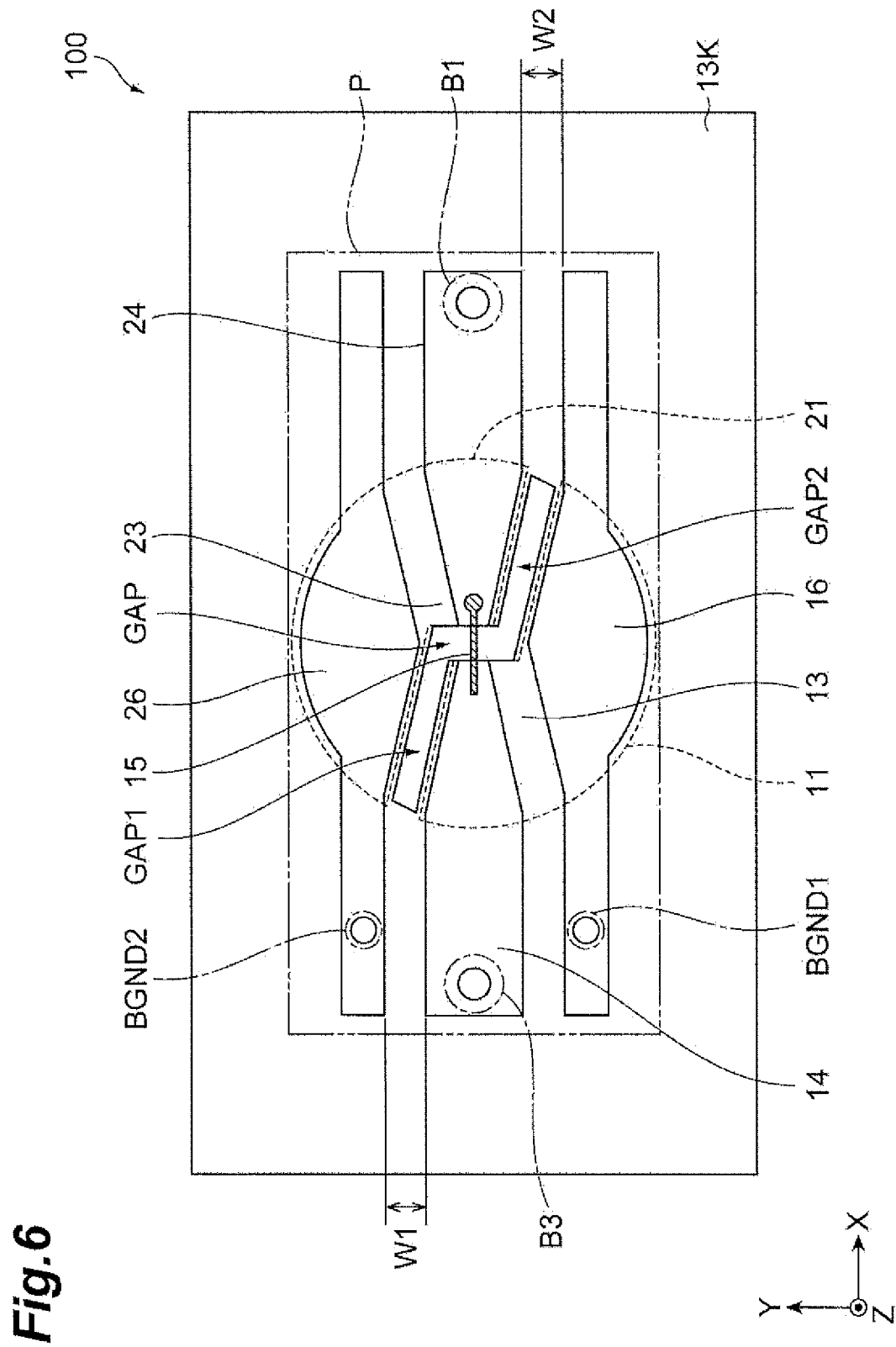
FIG. 6 is a plan view of a substrate in the MEMS switch illustrated in FIG. 5.

FIG. 6 is a plan view of a substrate in the MEMS switch illustrated in FIG. 5 (a plan view viewed in a direction indicated by arrow VI-VI).

The first beam 13 and the second beam 23 are portions of the substrate 13K including the beams, and an outer region (surrounding region) indicated by a two-dot chain line P of the substrate 13K is interposed between the first member PK(1) and the second member PK(2).

The first signal line 14 is provided on the first beam 13, and the second signal line 24 is provided on the second beam 23. A width of each of the signal lines is smaller toward a tip portion thereof. A space GAP serving as a gap is interposed between the tip portions of the first beam 13 and the second beam 23, and the contact terminal 15 extends across the space GAP.

The first GND 16, which is a ground electrode fixed on the first beam 13, is electrically connected to a first ground electrode pad BGND1, and the second GND 26 which is a ground electrode fixed on the second beam 23 is electrically connected to a second ground electrode pad BGND2.

A planar shape of the first GND 16 is a fan shape, a planar shape of the second GND 26 is also the same fan shape, and the GNDs are arranged in point symmetry around a centroid of the space GAP between the beam tip portions. Therefore, an arc on an outside of the second GND 26 overlaps an orbit of a virtual circle including an arc on an outside of the first GND 16. A region inside of the virtual circle is a region of the effectively bent beam in the substrate 13K, and a thickness inside this region may be smaller than a thickness outside the region.

Further, the first beam 13 and the second beam 23 are also arranged in point symmetry around the centroid of the space GAP between the beam tip portions. Similarly, the first signal line 14 and the second signal line 24 are also arranged in point symmetry around the centroid of the space GAP between the beam tip portions.

A space GAP1 and a space GAP2 serving as gaps continuous to the above-described space GAP extend in opposite directions from both end portions in the Y-axis direction of the space GAP in the XY plane. One space GAP1 extends in parallel to one side surface of the first signal line 14, extends in parallel to a side in a radial direction of the second fan-shaped GND 26, and is interposed between the side surface and the side. The other space GAP2 extends in parallel to one side surface of the second signal line 24, extends in parallel to a side in a radial direction of the first fan-shaped GND 16, and is interposed between the side surface and the side.

This MEMS switch 100 includes the first beam 13, the first signal line 14 provided in the first beam 13, the first ground electrode (the first GND) 16 provided in the first beam 13 and adjacent to the first signal line 14, the second beam 23 adjacent to the first beam 13 via the gaps (GAP, GAP1, and GAP2), the second signal line 24 provided in the second beam 23, and the second ground electrode (the second GND) 26 provided in the second beam 23 and adjacent to the second signal line 24.

The switch includes the first driving element that deforms at least the first beam 13, and the contact terminal 15 is fixed to any one of the first signal line 14 and the second signal line 24 and performs connection between the first signal line 14 and the second signal line 24 according to the deformation of the first beam 13.

According to the MEMS switch 100, since the first signal line 14 and the first GND 16 are provided in the same first beam 13, it is possible to suppress a change in the characteristic impedance of the first signal line 14 without changing their relative position even when the first beam 13 is displaced by the first driving element.

Similarly, since the second signal line 24 and the second GND 26 are provided in the same second beam 23, it is possible to suppress a change in the characteristic impedance of the second signal line 24 without changing their relative position even when the second beam 23 is displaced by the second driving element.

Further, since both of the first beam 13 and the second beam 23 include the signal line and the ground electrode, their physical characteristics easily match. Therefore, it is possible to offset and reduce a change in characteristics of the component or a position of the contact terminal 15 for switching due to a change in temperature. Thus, the MEMS switch 100 can perform high-quality signal transfer by having high resistance against temperature change and bending of the beam.

For a coplanar waveguide structure, in the above-described MEMS switch, as illustrated in FIG. 6, the first signal line 14 and the first GND 16 (ground electrode) are provided on the first beam 13, the second signal line 24 and the second GND 26 (ground electrode) are provided on the second beam 23, the second GND 26 extends to be adjacent to the first signal line 14 via a first gap W1, and the first signal line 14 is located to be interposed between the first GND 16 and the second GND 26 to thereby constitute a first coplanar waveguide, and the first GND 16 extends to be adjacent to the second signal line 24 via a second gap W2 and the second signal line 24 is located to be interposed between the second GND 26 and first GND 16 to constitute a second coplanar waveguide.

A coplanar waveguide is a transmission line in which a signal line and a ground electrode transmitting a signal are located on the same plane on a dielectric substrate, and since a gap between the signal line and the ground electrode is set to be constant and an electromagnetic field distribution is similar to a coaxial line, leakage of electromagnetic waves is known to be less. Further, the coplanar waveguide has an advantage in that a phase constant or characteristic impedance can be adjusted in a wide range by adjusting a width or a gap of the line.

Further, in the MEMS switch 100, the first beam 13 and the second beam 23 are arranged in point symmetry in a plan view. Since displacement operations thereof are also point-symmetrical to each other when the beams are arranged in point symmetry, temperature displacement amounts and bending operations of the beams are the same. Therefore, it is possible to suppress a variation in a contact position of the contact terminal 15 due to a difference in a temperature change and a bending operation, and to suppress degradation of signal transfer quality.

Figure 7:
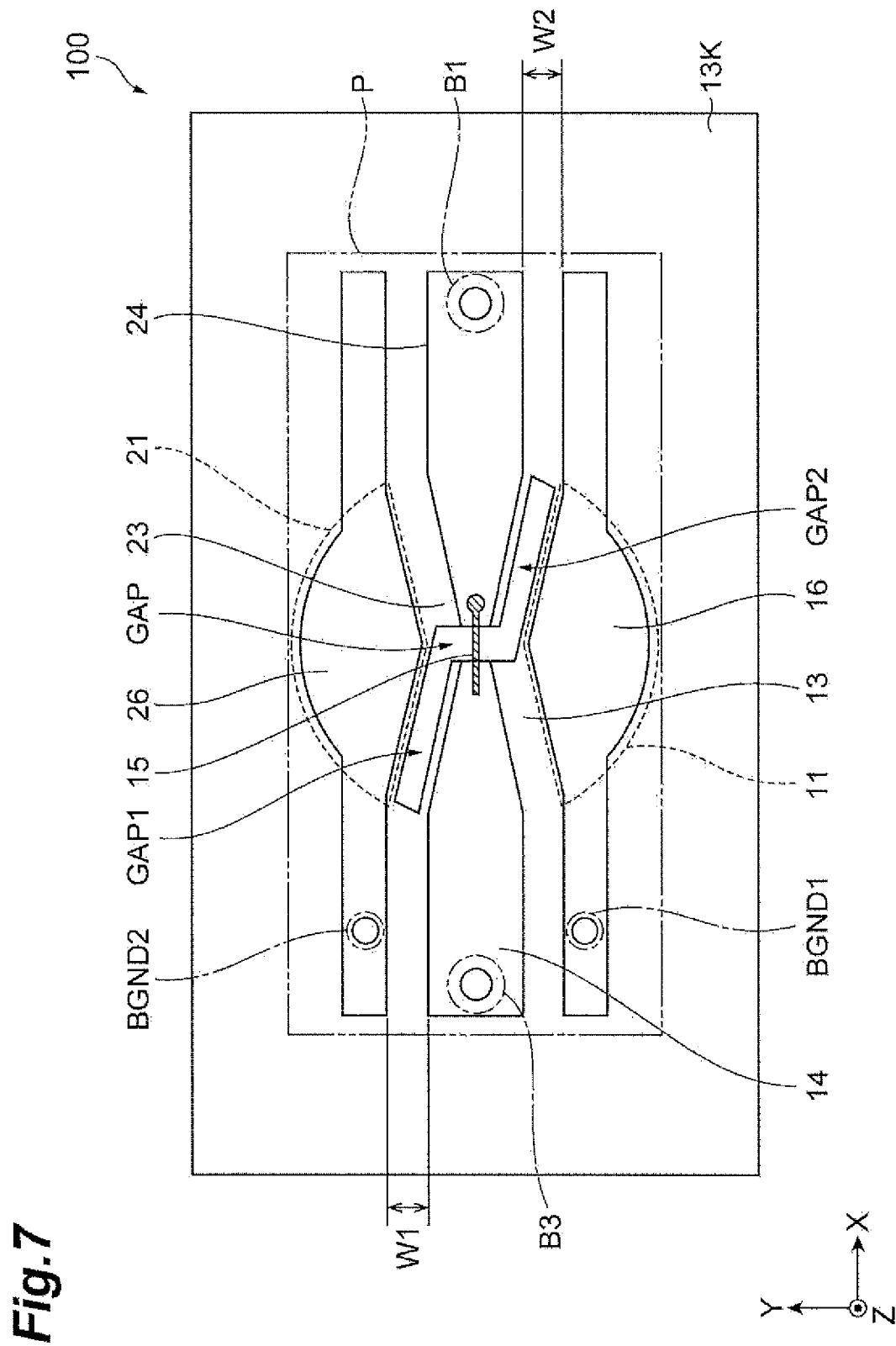
FIG. 7 is a plan view of a substrate in which the MEMS switch illustrated in FIG. 6 is improved.
Figure 8:
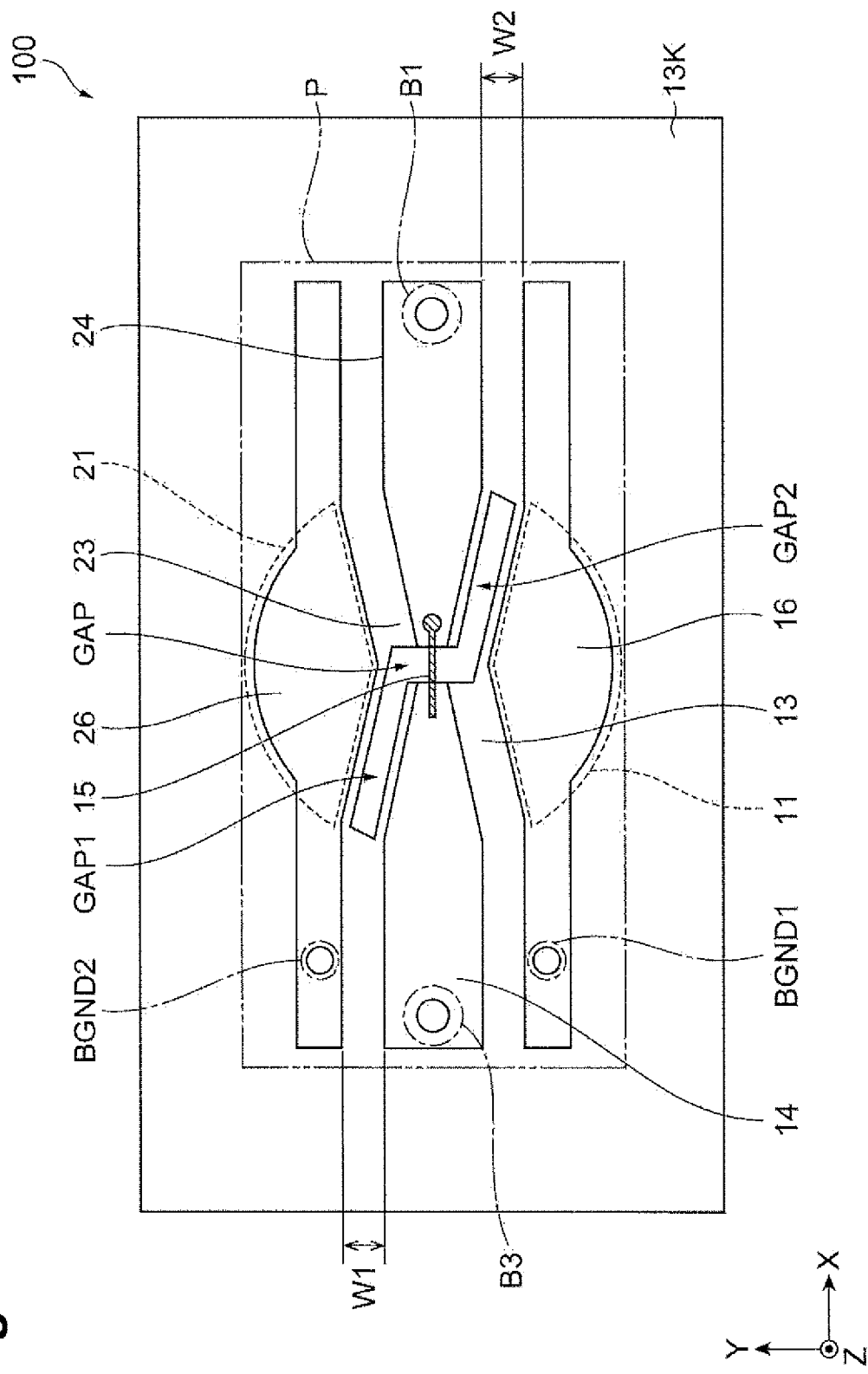
FIG. 8 is a plan view of a substrate in which the MEMS switch illustrated in FIG. 7 is improved.

FIGS. 7 and 8 are plan views of a substrate in which the MEMS switch illustrated in FIG. 6 is improved.

In FIG. 6, the first driving element 11 and the second driving element 21 configured with piezoelectric elements are present under the first GND 16 and the second GND 26 and the first signal line 14 and the second signal line 24. In this example, the first driving element 11 and the second driving element 21 are respectively arranged at positions overlapping the first GND 16 and the second GND 26 when viewed in the Z-axis direction. Therefore shapes of the first driving element 11 and the second driving element 21 match with the exception of a slight margin region with respect to the first GND 16 and the second GND 26 to a fan shape.

Even when the driving element is fixed in this region, the first beam 13 and the second beam 23 operate similarly to the above due to being bent when a driving voltage is applied due to a bimetal effect, but there is an advantage in that an influence on the signal line is smaller since the driving element is not in a position overlapping the signal line. In the example of FIG. 8, an outer edge on the signal line (14 and 24) side of the first driving element 11 and the second driving element 21 is located away from each signal line relative to an outer edge on the signal line (14 and 24) side of the first GND 16 and the second GND 26, and is provided inside each GND. Therefore, there is an advantage in that the influence on the signal line of the driving element can be further reduced in comparison to the case of FIG. 7.

Figure 9:
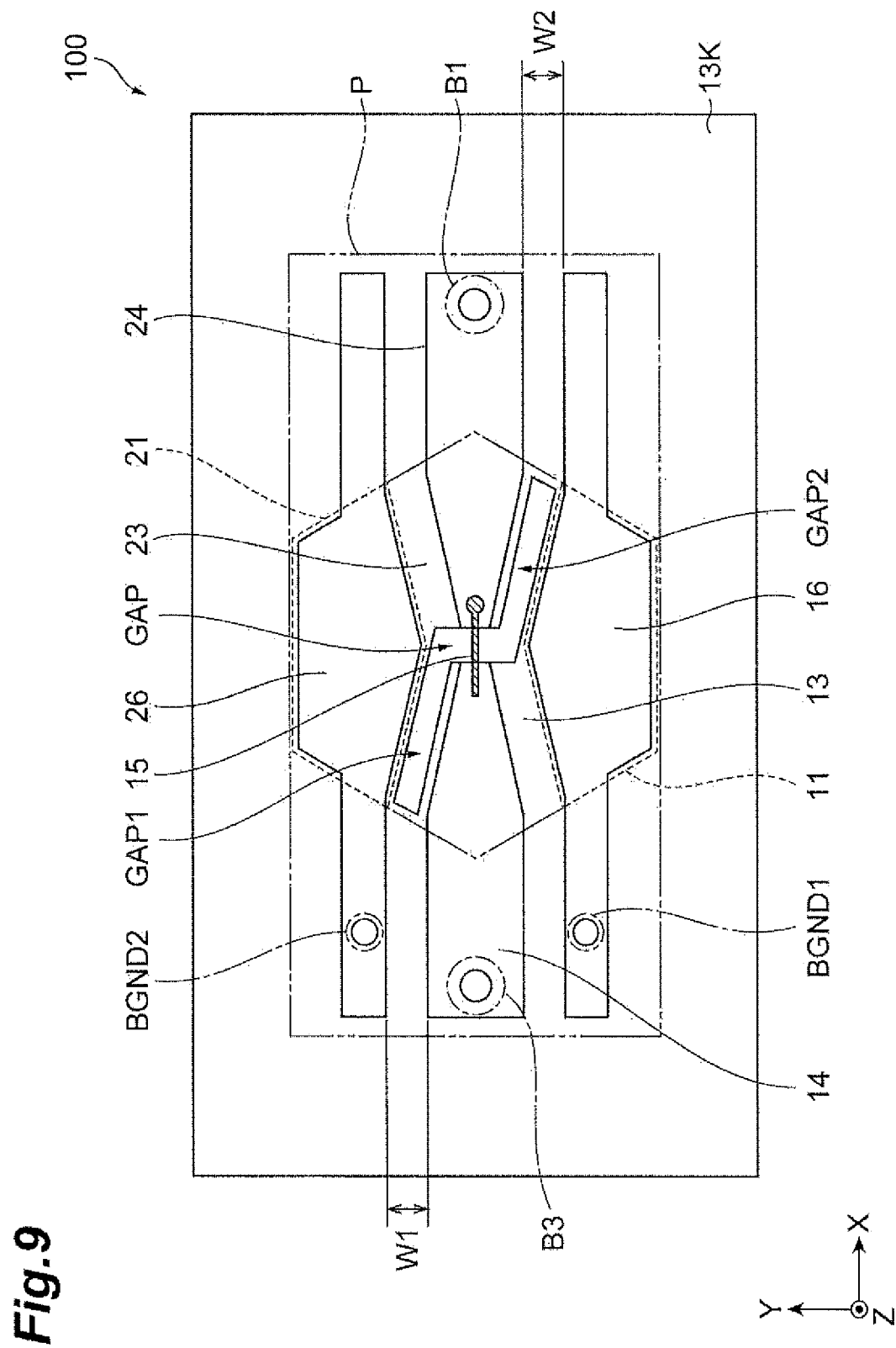
FIG. 9 is a plan view of a substrate in which the MEMS switch illustrated in FIG. 7 is modified.
Figure 10:
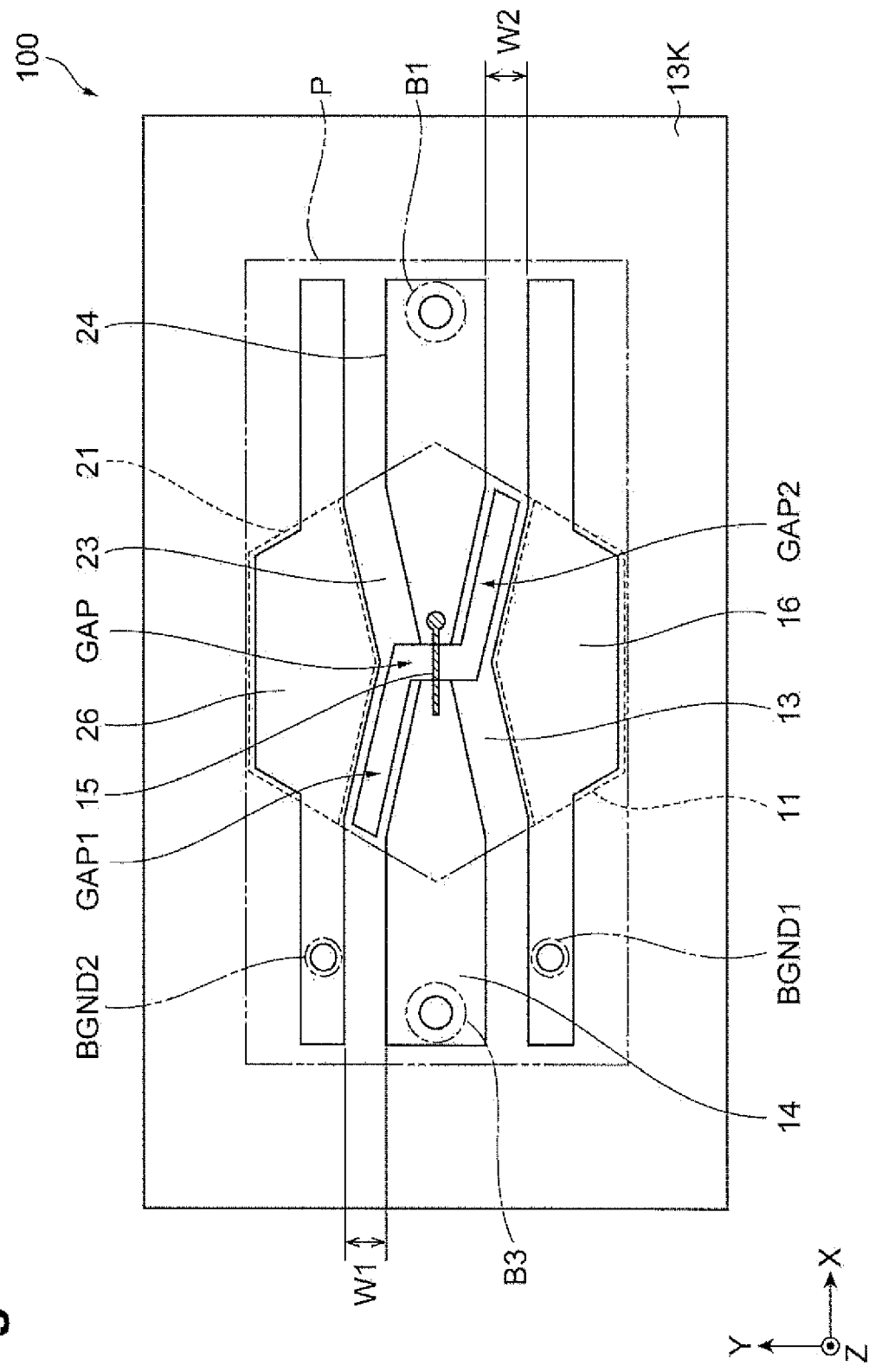
FIG. 10 is a plan view of a substrate in which the MEMS switch illustrated in FIG. 8 is modified.

FIGS. 9 and 10 are plan views of a substrate in which the MEMS switch illustrated in FIGS. 7 and 8 is modified.

In this example, a virtual shape that overlaps an outermost circumferential side of the ground electrode is not a circle but a regular hexagon. In this case, a single ground electrode shape, as well as that of the first GND 16 and the second GND 26, is a pentagon. Other structures, operations, and effects are the same as those described above.

Figure 11:
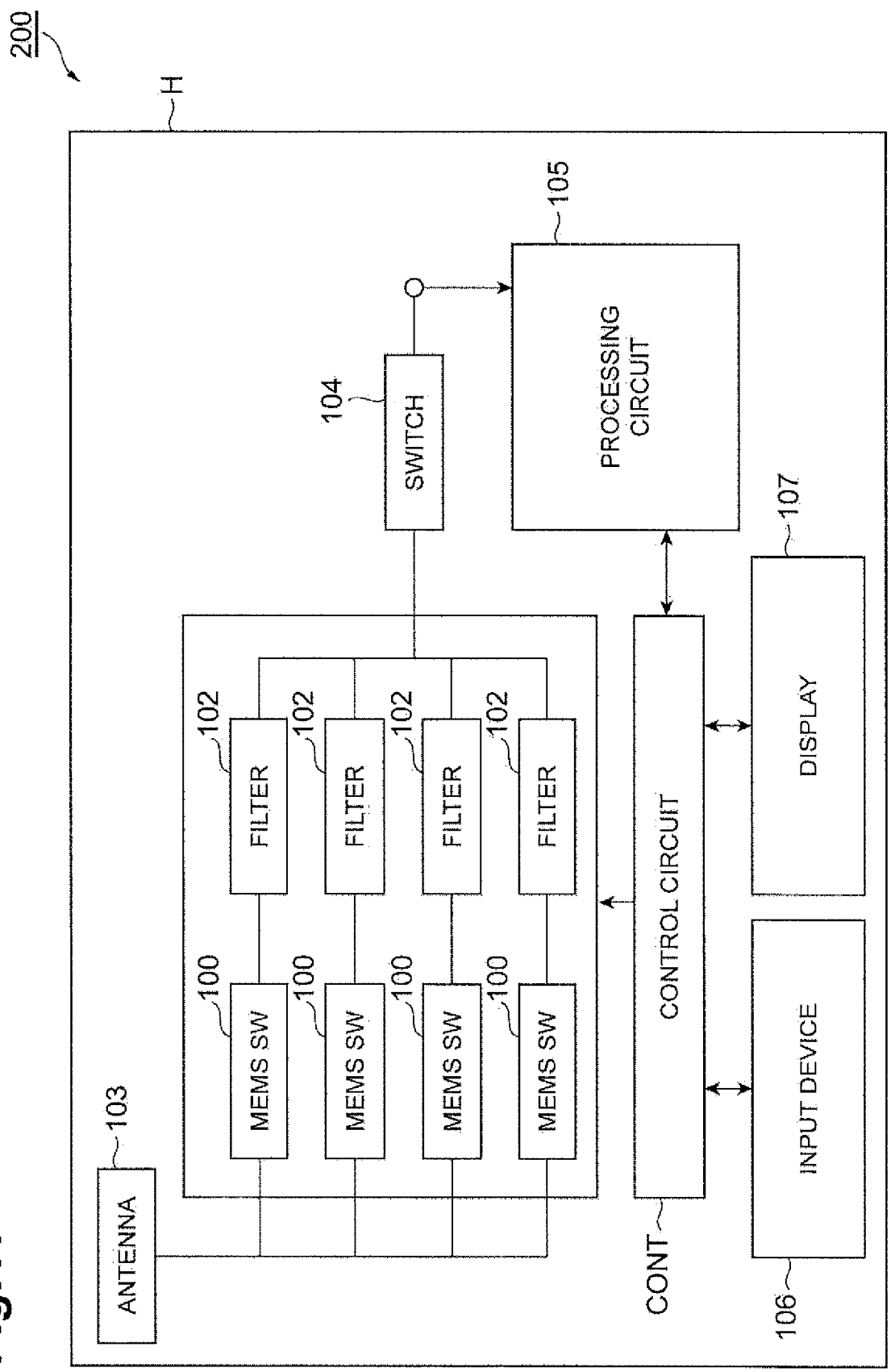
FIG. 11 is a schematic configuration diagram of an example of an electronic device to which a MEMS switch according to this embodiment is applied.

The MEMS switch 100 described in this specification can be applied to, for example, an electronic device illustrated in FIG. 11.

FIG. 11 is a schematic configuration diagram of an example of an electronic device to which a MEMS switch according to this embodiment is applied.

An electronic device 200 illustrated in FIG. 11 is an electronic device that performs wireless communication and includes a plurality of MEMS switches 100 accommodated in a housing H, filters 102 connected in series to the plurality of MEMS switches 100, an antenna 103, a switch 104, a processing circuit 105, an input device 106, a display 107, and a control circuit CONT.

A modulated high frequency signal (an RF signal) is input from the antenna 103. In the electronic device 200, ON/OFF in the plurality of MEMS switches 100 are switched under control of the control circuit CONT. For example, a signal supplied from the antenna can be connected to a specific filter 102, and a signal in a single frequency band can be selected from signals in a plurality of frequency bands involved in the antenna. An input signal received by the antenna 103 is amplified by an amplifier if necessary, and then is input to the processing circuit 105 via a MEMS switch 100 in which an ON state is selected, the filter 102 connected to the MEMS switch 100, and the switch 104, and a process according to the input signal is performed in the processing circuit 105. The respective filters 102 are frequency filters having different pass bands, and a signal at a selected frequency is input to the processing circuit 105.

The processing circuit 105 may demodulate the modulated input signal and extract character or image information from the demodulated signal, and the control circuit CONT may display the character or image information obtained from the processing circuit 105 on the display 107. The input signal directed to the antenna 103 may also be a video signal or an audio signal.

Further, information input from the input device 106 by a user is sent to the control circuit CONT and reflected in the control of the plurality of MEMS switches 100 in the control circuit CONT. For example, a result of a process in the processing circuit 105 is output to the display 107 via the control circuit CONT, and the user is notified of the result. The electronic device may be a portable electronic device.

In the MEMS switch 100 according to this embodiment, as described above, contact and separation between the contact portion 15b and the second signal line 24 are repeated due to piezoelectric driving of the first driving element 11 and the second driving element 21 such that connection and disconnection between the second signal line 24 and the contact terminal 15 are repeated.

The electronic device using the above MEMS switch includes the MEMS switches 100, the antenna 103, and the frequency filters 102 connected to the antenna 103 via the MEMS switches 100. This electronic device can perform a high-performance operation in which there are less malfunctions since the MEMS switch performs high-quality signal transfer. The antenna 103 is a signal input element that performs signal input to the MEMS switches 100, and the frequency filters 102 are signal processing elements that process output signals from the MEMS switches 100. For example, a signal generator in an experimental system can be applied as the signal input element, and a frequency multiplier or an AD converter can be applied as the signal processing element.

In the above-described MEMS switch, it is necessary for a beam to be thinned so that switching can be smoothly performed through facilitated deformation of the beam. A layer thinning process may include a back-grinding process in addition to a creation of a thin film in a thin film formation process such as CVD or sputtering, but a method such as polishing or etching, in addition to the grinding, may be considered as such a process.

According to the above-described structure, stable CPW formation can be achieved and high RF performance and stabilization (variation reduction) can be achieved regardless of the deformation (switching, warping in fabrication, or thermal stress warping) of the MEMS. Further, since a plurality of switches can be arranged, multi-channeling can be performed.

Next, a configuration example of a MEMS switch capable of suppressing a change in characteristic impedance of a signal line and a change in high frequency signal transmission performance due to deformation of a flexible member caused by film stress or thermal stress will be described.

First Configuration Example

Figure 12:
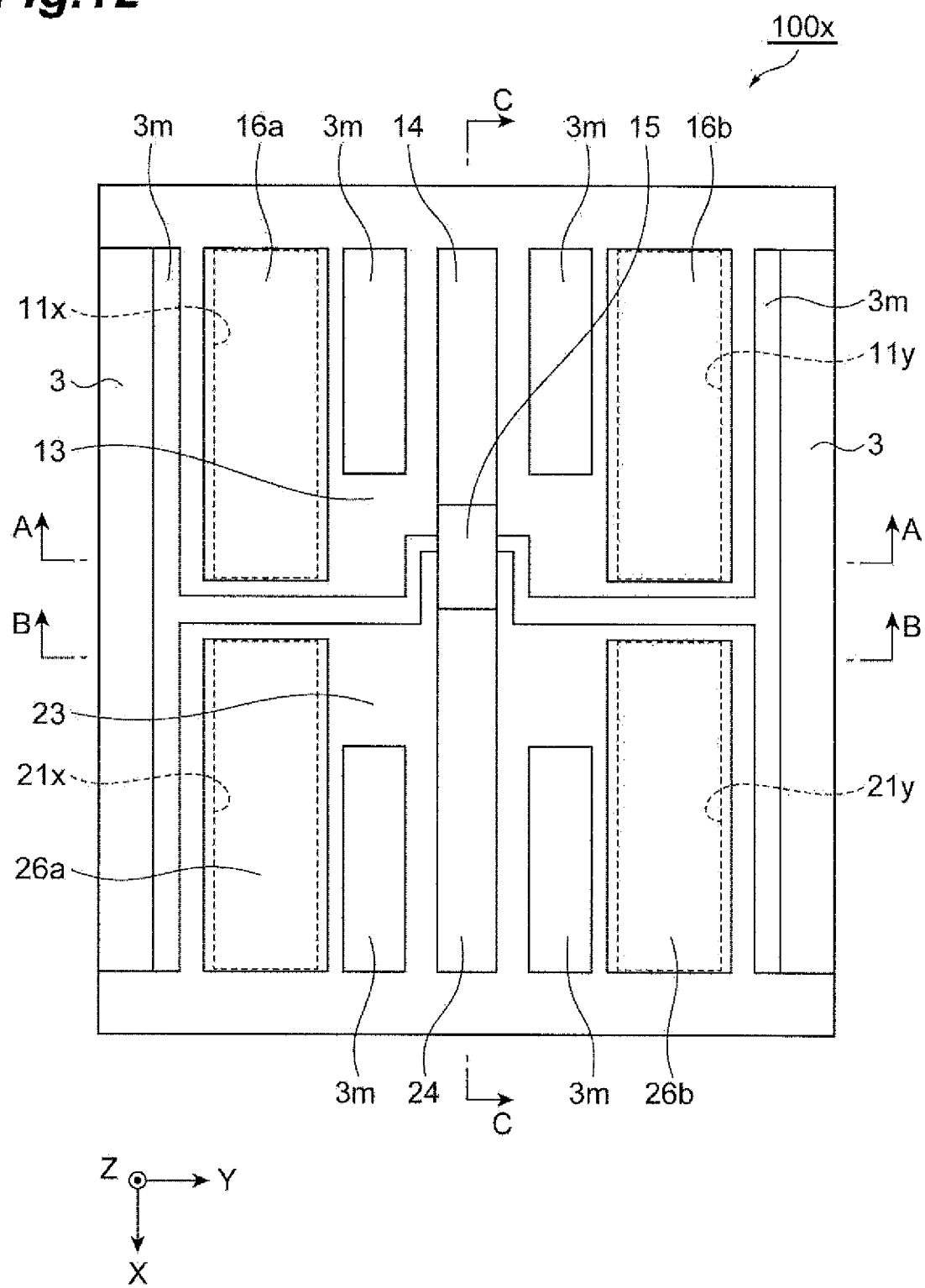
FIG. 12 is a plan view illustrating a MEMS switch according to a first configuration example.
Figure 13:
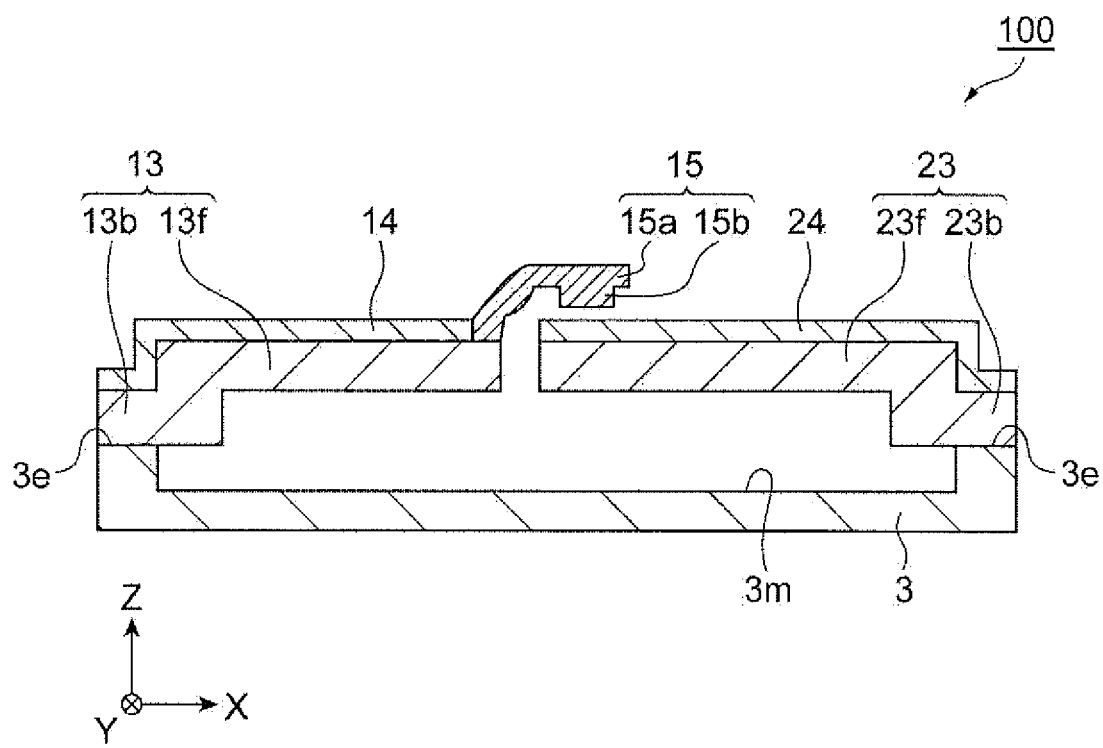
FIG. 13 is an end view of the MEMS switch taken along line C-C in FIG. 12.

FIG. 12 is a plan view illustrating a MEMS switch according to a first configuration example, FIG. 13 is an end view of the MEMS switch taken along line C-C in FIG. 12, FIG. 14A is an end view of the MEMS switch along line A-A in FIG. 12, and FIG. 14B is an end view of the MEMS switch taken along line B-B in FIG. 12. FIGS. 13, 14A and 14B illustrate a configuration of the MEMS switch that is in a state in which the first signal line 14 is electrically disconnected from the second signal line 24 (an OFF state). The MEMS switch 100 in this configuration example is a piezoelectric MEMS switch using a piezoelectric driving element as a driving element.

As illustrated in FIGS. 12 to 14B, the MEMS switch 100 of this configuration example includes a substrate 3, a first pair of driving elements 11x and 11y, a first beam 13, a first signal line 14, a contact terminal 15 for a signal line, a first pair of grounds (GND) 16a and 16b, a second beam 23, a second pair of driving elements 21x and 21y, a second signal line 24, a second pair of grounds (GND) 26a and 26b. The substrate 3 corresponds to a portion or all of the fixing member PK (see FIG. 1). The first pair of driving elements 11x and 11y correspond to the first driving element 11 (see FIG. 1), and the second pair of driving elements 21x and 21y correspond to the second driving element 21 (see FIG. 1). The first pair of GNDs 16a and 16b correspond to the first GND 16 (see FIG. 1), and the second pairs of GNDs 26a and 26b correspond to the second GND 26 (see FIG. 1).

One end portion of the first beam 13 and the second beam 23 is cantilever-supported by the substrate 3 so that the first beam 13 and the second beam 23 have a cantilever structure. Specifically, the first beam 13 includes an end portion 13b and a separation portion 13f. The end portion 13b is fixed on an end portion 3e in a −X direction of the substrate 3. The separation portion 13f is fixed to the end portion 13b and separated in a +Z direction from a main surface 3m of the substrate 3. Accordingly, a +X direction of a tip portion of the first beam 13 is a free end. The main surface 3m is a surface extending (for example, in parallel) along an XY plane. Similarly, the second beam 23 includes an end portion 23b and a separation portion 23f. The end portion 23b is fixed on the end portion 3e in the +X direction of the substrate 3. The separation portion 23f is fixed to the end portion 23b and separated in the +Z direction from the main surface 3m of the substrate 3. Thus, a tip portion in the −X direction of the second beam 23 is a free end. In the OFF state, since the tip portion of the first beam 13 and the tip portion of the second beam 23 are separated and opposed in an X-axis direction, the first signal line 14 and the second signal line 24 provided on the first beam 13 and the second beam 23 are also separated and opposed in the X-axis direction.

The first pair of GNDs 16a and 16b are provided on the separation portion 13f of the first beam 13, and the second pair of GNDs 26a and 26b are provided on the separation portion 23f of the second beam 23. In a plan view (that is, when viewed from the +Z direction to a −Z direction), the first pair of GNDs 16a and 16b are separated from the first signal line 14 in a Y-axis direction, are provided so that the first signal line 14 is interposed therebetween in the Y-axis direction, and extend along the first signal line 14. Similarly, in the plan view, the second pair of GNDs 26a and 26b are separated from the second signal lines 24 in the Y-axis direction, are provided so that the second signal line 24 is interposed therebetween in the Y-axis direction, and extend along the second signal line 24.

The first pair of driving elements 11x and 11y are provided in the separation portion 13f of the first beam 13, and the second pair of driving elements 21x and 21y are provided in the separation portion 23f of the second beam 23. The driving element 11x, the driving element 11y, the driving element 21x, and the driving element 21y extend along the GND 16a, the GND 16b, the GND 26a, and the GND 26b, respectively. In a plan view, the entire driving element 11x, the entire driving element 11y, the entire driving element 21x, and the entire driving element 21y overlap the GND 16a, the GND 16b, the GND 26a, and the GND 26b, respectively. Further, in the plan view, the driving element 11x and the driving element 11y do not overlap the first signal line 14, and the driving element 21x and the driving element 21y do not overlap the second signal line 24.

An insulating material may be interposed between the driving element 11x and the GND 16a, between the driving element 11y and the GND 16b, between the driving element 21x and the GND 26a, and between the driving element 21y and the GND 26b. That is, a structure in which, in a Z direction, the driving elements 11x, the insulating material, and the GND 16a are sequentially laminated, the driving elements 11y, the insulating material, and the GND 16b are sequentially laminated, the driving element 21x, the insulating material, and the GND 26a are sequentially laminated, and the driving element 21y, the insulating material, and the GND 26b are sequentially laminated can be adopted. In this configuration example, a case in which the insulating material is an insulating layer formed of a portion of a material constituting the separation portion 13f has been illustrated, but the insulating material may be an insulating layer formed of a material different from the material constituting the separation portion 13f. Alternatively, a high-resistance material may be used in place of the insulating material.

The first signal line 14 and the first pair of GNDs 16a and 16b are provided in substantially the same vertical position in a Z-axis direction in the separation portion 13f of the first beam 13. Accordingly, since the first signal line 14 is interposed in substantially the same plane between the first pair of GNDs 16a and 16b, the first pair of GNDs 16a and 16b can stabilize a function of setting impedance as a coplanar line. Similarly, the second signal line 24 and the second pair of GNDs 26a and 26b are provided at substantially the same vertical positions in the Z-axis direction within the separation portion 23f of the second beam 23. Accordingly, since the second signal line 24 is interposed in substantially the same plane between the second pair of GNDs 26a and 26b, the second pair of GNDs 26a and 26b can stabilize a function of setting impedance as a coplanar line. The driving element 11x and the driving element 11y are provided at substantially the same vertical positions in the Z-axis direction within the separation portion 13f of the second beam 13. The driving element 21x and the driving element 21y are provided at substantially the same vertical positions in the Z-axis direction within the separation portion 23f of the second beam 23.

It is preferable for distances D16a and D16b from the first pair of GNDs 16a and 16b to the first signal line 14 (in this configuration example, the distances D16a and D16b are separation distances in the Y-axis direction between elements and are approximately equal to separation distances in the Y-axis direction from the first pair of GNDs 16a and 16b to the second signal line 24) to be shorter than distances T16a and T16b from the first signal line 14 to the first pair of driving elements 11x and 11y (in this configuration example, the distances T16a and T16b are separation distances in the Y-axis direction between such elements and are approximately equal to separation distances in the Y-axis direction from the second signal line 24 to the first pair of driving elements 11x and 11y). When the first signal line 14 is near the lower electrode 11a and the upper electrode 11c that are electrodes that drive the first pair of driving elements 11x and 11y, the elements are electrically coupled, and it is easy for characteristic impedance to be shifted from a predetermined value. Accordingly, a transmission loss of a high frequency signal passing through the first signal line 14 increases. Therefore, with the configuration described above, since the first pair of GNDs 16a and 16b are closer to the first signal line 14 than they are to the first pair of driving elements 11x and 11y, it is possible to suppress the increase in transmission loss based on the reason described above.

On the basis of the same reason, it is preferable for distances D26a and D26b from the second pair of GNDs 26a and 26b to the second signal line 24 (in this configuration example, the distances D26a and D26b are separation distances in the Y-axis direction between such elements) to be shorter than distances T26a and T26b from the second signal line 24 to the second pair of driving elements 21x and 21y (in this example configuration, the distances T26a and T26b are separation distances in the Y-axis direction between the elements).

FIGS. 15A and 15B are end views of a MEMS switch that is in a state in which the first signal line 14 is electrically connected to the second signal line 24 (the ON state), and illustrate end faces corresponding to those in FIGS. 13 and 14A, respectively. As illustrated in FIGS. 15A and 15B, when the MEMS switch 100 is changed from the OFF state to the ON state, the driving element 11x and the driving element 11y are deformed. Accordingly, the first beam 13 is deformed to be bent and the tip portion of the first beam 13 is moved in the −Z direction so that the contact portion 15b of the contact terminal 15 comes into contact with the second signal line 24. When a change from the ON state to the OFF state occurs again, the contact portion 15b of the contact terminal 15 is separated from the second signal line 24 due to the deformed driving element 11x and the deformed driving element 11y returns to its original shape. Thus, the OFF state and the ON state of the MEMS switch 100 are reversibly switched by the contact terminal 15.

In the MEMS switch 100 according to this configuration example as described above, the first signal line 14 and the first pair of GNDs 16a and 16b are all provided in the separation portion 13f of the first beam 13 (see FIGS. 12 to 14B). Therefore, even when the first pair of driving elements 10x and 11y overlapping the first pair of GNDs 16a and 16b in the plan view are deformed due to film stress or thermal stress, a relative positional relationship between the first signal line 14 and the first pair of GNDs 16a and 16b is hardly changed or is not changed at all. Thus, according to the MEMS switch 100 in this configuration example, it is possible to suppress a change in characteristic impedance of the first signal line and a change in transmission performance of a high-frequency signal due to deformation of the flexible member caused by film stress or thermal stress.

Further, in the MEMS switch 100 according to this configuration example as described above, the first signal line 14 does not overlap the first pair of driving elements 11x and 11y in the separation portion 13f of the first beam 13 in a plan view (see FIG. 12). If the first signal line 14 overlaps the first pair of driving elements 11x and 11y in a plan view, electrode portions (the upper electrode 11c and the lower electrode 11a; see FIG. 14A) of the pair of driving elements 11x and 11y having a potential that is not a floating potential will exist under the first signal line 14. If such electrode portions exist, transmission loss of a high frequency signal passing through the first signal line 14 increases. Therefore, it is possible to suppress an increase in transmission loss due to the electrode portions of the pair of driving elements 11x and 11y on the basis of the above-described configuration.

Second Configuration Example

Figure 16:
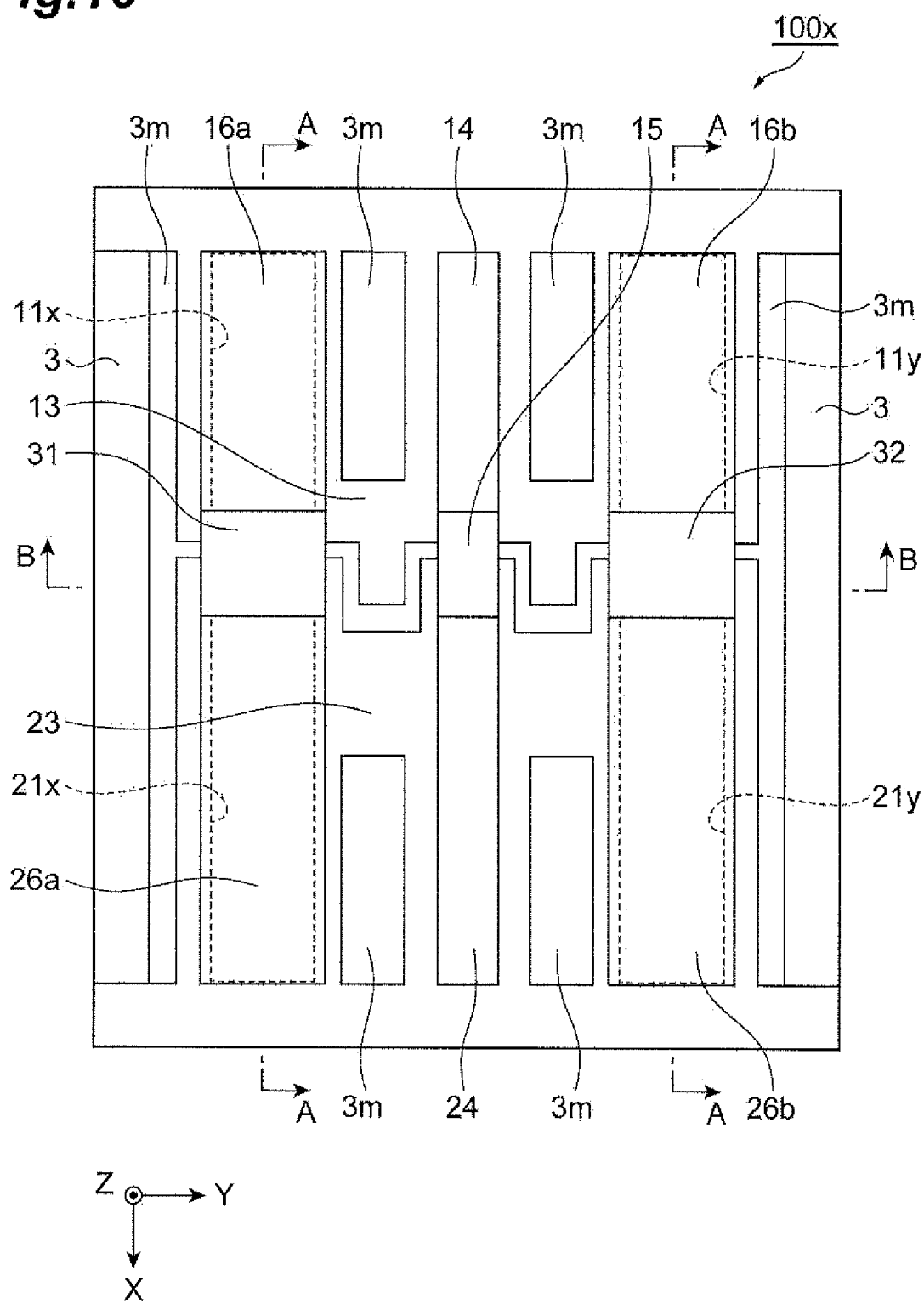
FIG. 16 is a plan view illustrating a MEMS switch according to a second configuration example.

Next, a MEMS switch according to a second configuration example will be described. FIG. 16 is a plan view illustrating a MEMS switch 100x according to the second configuration example, FIG. 17A is an end view of the MEMS switch taken along line A-A of FIG. 16, and FIG. 17B is an end view of the MEMS switch taken along line B-B of FIG. 16. FIGS. 16, 17A and 17B illustrate a configuration of a MEMS switch that is in a state in which the first signal line 14 is electrically disconnected from the second signal line 24 (the OFF state). The MEMS switch 100x in this configuration example is a piezoelectric MEMS switch using a piezoelectric driving element as a driving element or an electrostatic MEMS switch using an electrostatic driving element as a driving element.

As illustrated in FIGS. 16, 17A, and 17B, the MEMS switch in this configuration example is primarily different from the MEMS switch in the first configuration example in that the first beam 13 further includes a pair of contact terminals 31 and 32 for grounding.

The contact terminal 31 is provided at the end portion on the free end side of the first beam 13 (an end portion on a +X-axis side of the separation portion 13f) and is connected to the GND 16a. The contact terminal 31 includes a body portion 31a connected to the first beam 13 and a contact portion 31b projecting from the body portion 31a. The contact portion 30b is provided at a position facing the GND 26a in the body portion 31a. The contact terminal 31 is formed of a conductor such as Au. In the OFF state, the contact terminal 31 is provided in an end portion on a side opposite to an end portion on a side connected to the GND 16a in the body portion 31a and arranged in a state in which the contact portion 31b projecting toward the GND 26a is separated from the GND 26a. The contact portion 31b of the contact terminal 31 may be the same material as that of the body portion 31a of the contact terminal 31 or may be a material different from that of the body portion 31a. Connection and disconnection between the GND 16a and the GND 26a are switched by the contact terminal 31.

The contact terminal 32 has the same configuration as the contact terminal 31. That is, the contact terminal 32 is provided at the end portion on the free end side of the first beam 13 (an end portion on a +X-axis side of the separation portion 13f), and is connected to the GND 16b. The contact terminal 32 includes a body portion 32a connected to the first beam 13 and a contact portion 32b projecting from the body portion 32a. The contact portion 32b is provided at a position facing the GND 26b in the body portion 32a. The contact terminal 32 is formed of a conductor such as Au. In the OFF state, the contact terminal 32 is provided in an end portion on a side opposite to an end portion on a side connected to the GND 16b in the body portion 32a and arranged in a state in which the contact portion 32b projecting toward the GND 26b is separated from the GND 26b. The contact portion 32b of the contact terminal 32 may be the same material as that of the body portion 32a of the contact terminal 32 or may be a material different from that of the body portion 32a. Connection and disconnection between the GND 16b and the GND 26b are switched by the contact terminal 32.

Since the contact terminal 31 and the contact terminal 32 are provided in the separation portion 13f of the first beam 13 similarly to the contact terminal 15, the contact terminal 31 and the contact terminal 32 are moved similarly to the contact terminal 15 due to the deformation of the first beam 13 by the first pair of driving elements 11x and 11y. Therefore, when the contact terminal 15 switches between electrical connection and disconnection between the first signal line 14 and the second signal line 24 due to the deformation of the first beam 13 by the first pair of driving elements 11x and 11y, and, due to deformation of the first beam 13 by the first pair of driving elements 11x and 11y, the contact terminal 31 switches between electrical connection and disconnection between the GND 16a and the GND 26a and the contact terminal 32 switches between electrical connection and disconnection between the GND 16b and the GND 26b.

In the OFF state, each of a separation distance in the Z-axis direction between the contact portion 31b of the contact terminal 31 and the GND 26a and a separation distance in the Z-axis direction between the contact portion 32b of the contact terminal 32 and the GND 26b may be shorter than a separation distance in the Z-axis direction between the contact portion 15b of the contact terminal 15 and the second signal line 24.

Figure 18A:
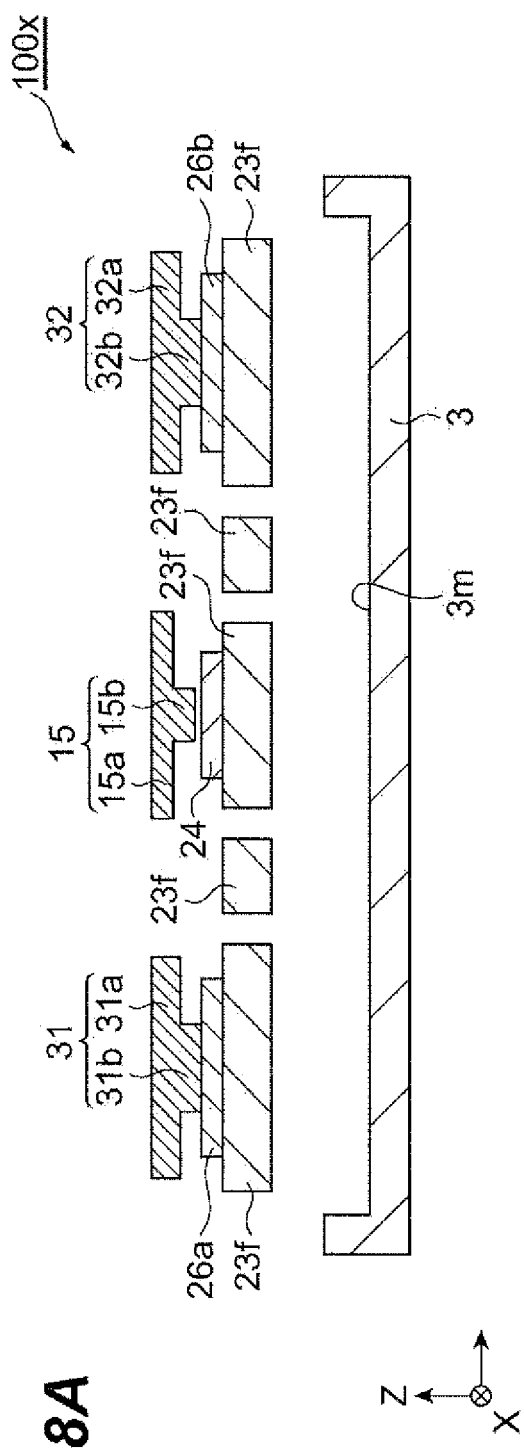
FIG. 18A is an end view of the MEMS switch in an intermediate stage of a transition from a state in which a first signal line is electrically disconnected from a second signal line to a state in which the first signal line is electrically connected to the second signal line.
Figure 18B:
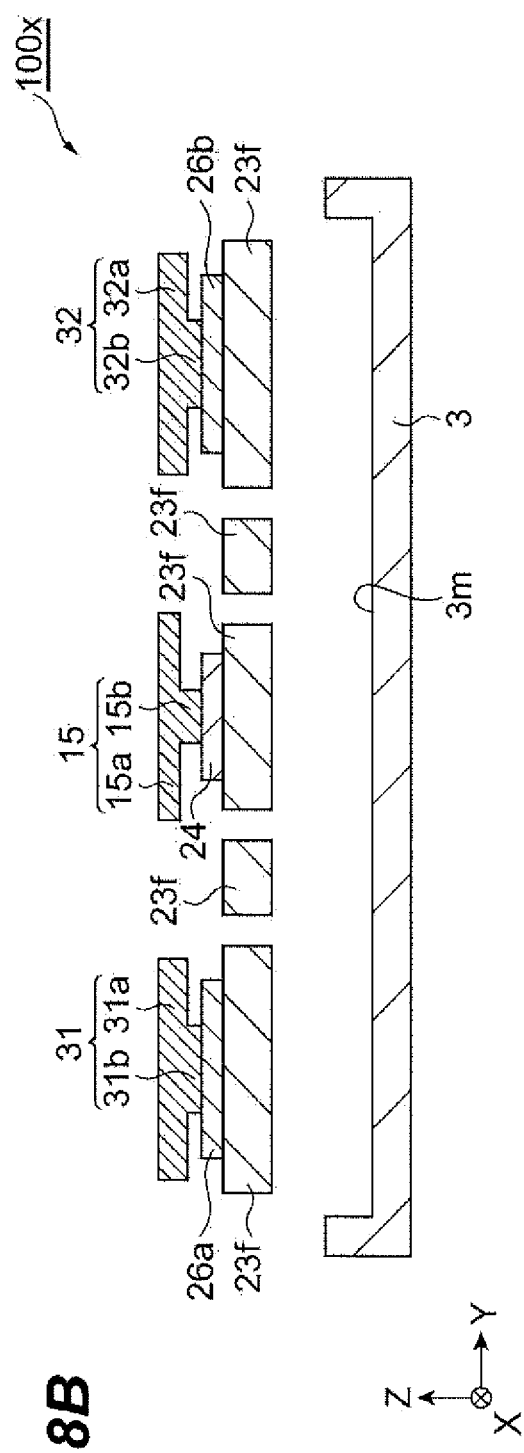
FIG. 18B is an end view of the MEMS switch in the state in which the first signal line is electrically connected to the second signal line.

FIG. 18A is an end view of the MEMS switch in an intermediate stage of a transition from a state in which the first signal line 14 is electrically disconnected from the second signal line 24 (the ON state) to a state in which the first signal line 14 is electrically connected to the second signal line 24 (the OFF state), and FIG. 18B is an end view of the MEMS switch in the ON state and illustrates an end face corresponding to FIG. 17B.

As illustrated in FIG. 18A, in the intermediate stage of the transition from the ON state to the OFF state, the contact portion 31b of the contact terminal 31 comes into contact with the GND 26a and the contact portion 32b of the contact terminal 32 comes into contact with the GND 26b, whereas the body portion 15a of the contact terminal 15 does not come into contact with the second signal line 24. Thereafter, as illustrated in FIG. 18B, the contact portion 15b of the contact terminal 15 also comes into contact with the second signal line 24 in the ON state.

Therefore, a timing at which the pair of contact terminals 31 and 32 switch the GND 16a and the GND 26a and the GND 16b and the GND 26b from an electrical disconnection state to a connection state due to the deformation of the first beam 13 by the first pair of driving elements 11x and 11y is earlier than a timing at which the contact terminal 15 switches the first signal line 14 and the second signal line 24 from an electrical disconnection state to a connection state due to the deformation of the first beam 13 by the first pair of driving elements 11x and 11y.

As described above, in the MEMS switch 100x of this configuration example, electrostatic driving elements can be used as the first pair of driving elements 11x and 11y and the second pair of driving elements 21x and 21y. In that case, each of the first pair of driving elements 11x and 11y includes, for example, two separated electrode layers, and an electrostatic force can be generated between the electrode layers by applying a voltage between the electrodes layers. By generating or eliminating the electrostatic force, the first beam 13 can be deformed in the same aspect as in the case of the piezoelectric driving element as described above. Similarly, each of the second pair of driving elements 21x and 21y includes, for example, two separated electrode layers, and an electrostatic force can be generated between the electrode layers by applying a voltage between the electrodes layers. By generating or eliminating the electrostatic force, the second beam 23 can be deformed in the same aspect as in the case of the piezoelectric driving element as described above.

According to the MEMS switch 100x according to this configuration example as described above, it is possible to suppress a change in characteristic impedance of the first signal line and a change in transmission performance of a high-frequency signal due to deformation of a flexible member caused by film stress or thermal stress, on the basis of the same reason as in the MEMS switch 100 according to the first configuration example.

Further, the MEMS switch 100x according to this configuration example as described above includes the pair of contact terminals 31 and 32 configured as described above (see FIGS. 16 to 18A and 18B). Therefore, if the first signal line 14 is connected to the second signal line 24 by the contact terminal 15, the first pair of GNDs 16a and 16b and the second pair of GNDs 26a and 26b are electrically connected to each other by the pair of contact terminals 31 and 32 near a connection point of the first signal line 14 and the second signal line 24, and have the same potential (see FIGS. 18A and 18B). Therefore, it is possible to stabilize a function of setting the characteristic impedance of the first pair of GNDs 16a and 16b and the second pair of GND 26a and 26b near the connection point of the first signal line 14 and the second signal line 24. Therefore, it is possible to constitute a stable coplanar line.

Further, according to the MEMS switch 100x in the configuration example as described above, when the first signal line 14 and the second signal line 24 are switched from the electrical disconnection state to the connection state, the first pair of GNDs 16a and 16b are electrically connected to the second pair of GNDs 26a and 26b before the first signal line 14 is electrically connected to the second signal line 24 (see FIG. 11). Thus, the first signal line 14 can be electrically connected to the second signal line 24 after the function of setting the characteristic impedance of the first pair of GNDs 16a and 16b and the second pair of GNDs 26a and 26b is stabilized. Conversely, when switching is performed from the connection state to the disconnection state, the first signal line 14 is first electrically connected to the second signal line 24. Therefore, it is possible to reliably secure predetermined characteristic impedance in advance at a point in time at which a connection between the first signal line 14 and the second signal line 24 is established.

The present invention is not limited to the above embodiments, and various modification aspects are possible.

For example, although in the MEMS switch 100 of the first configuration example the entire driving element 11x, the entire driving element 11y, the entire driving element 21x, and the entire driving element 21y overlap the GND 16a, the GND 16b, the GND 26a, and GND 26b in a plan view, respectively (see FIG. 5), a portion of the driving element 11x, a portion of the driving element 11y, a portion of the driving element 21x, and a portion of the driving element 21y may overlap the GND 16a, the GND 16b, the GND 26a, and the GND 26b, respectively.

Further, although in the MEMS switch 100 of the first configuration example the first pair of driving elements 11x and 11y are provided in the separation portion 13f of the first beam 13 (see FIG. 5), only one driving element may be provided in the separation portion 13f and a portion of the one driving element may overlap at least a portion of the GND 16a and the GND 16b in a plan view. In this case, the portion of the one driving element may overlap the first signal line 14 in a plan view or may overlap nearly the entire separation portion 13f in a plan view.

Similarly, although in the MEMS switch 100 of the first configuration example the second pair of driving elements 21x and 21y are provided in the separation portion 23f of the second beam 23 (see FIG. 5), only one driving element may be provided in the separation portion 23f and a portion of the one driving element may overlap at least a portion of the GND 26a and the GND 26b in a plan view. In this case, the portion of the one driving element may overlap the second signal line 24 in a plan view or may overlap nearly the entire separation portion 23f in a plan view.

Further, although in the MEMS switch 100 of the first configuration example the first signal line 14 and the first pair of GNDs 16a and 16b are provided at substantially the same vertical position in the Z-axis direction in the separation portion 13f of the first beam 13 (see FIG. 14A), the first pair of GNDs 16a and 16b may be provided at a vertical position different from the first signal line 14 in the separation portion 13f of the first beam 13.

Similarly, although in the MEMS switch 100 of the first configuration example the second signal line 24 and the second pair of GNDs 26a and 26b are provided at substantially the same vertical position in the Z-axis direction in the separation portion 23f of the second beam 23 (see FIG. 14B), the second pair of GNDs 26a and 26b may be provided at a vertical position different from the second signal line 24 in the separation portion 23f of the second beam 23.

Further, although the first pair of GNDs 16a and 16b are electrically connected to the second pair of GNDs 26a and 26b before the first signal line 14 is electrically connected to the second signal line 24 (see FIGS. 18A and 18B) when the first signal line 14 and the second signal line 24 are switched from the electrical disconnection state to the connection state in the MEMS switch 100x of the second configuration example, the first pair of GNDs 16a and 16b may be electrically connected to the second pair of GNDs 26a and 26b at substantially the same time that the first signal line 14 is electrically connected to the second signal line 24.

What is claimed is:

1. A MEMS switch, comprising:
a first flexible member;
a first signal line provided to the first flexible member;
a first ground electrode provided to the first flexible member and adjacent to the first signal line;
a second flexible member adjacent to the first flexible member with a gap;
a second signal line provided to the second flexible member; and
a second ground electrode provided to the second flexible member and adjacent to the second signal line,
a first driving element that deforms at least the first flexible member; and
a contact terminal that is fixed to anyone of the first signal line and the second signal line and that performs connection between the first signal line and the second signal line according to the deformation of the first flexible member,
wherein the first signal line and the first ground electrode are provided on the first flexible member,
the second signal line and the second ground electrode are provided on the second flexible member,
the second ground electrode extends to be adjacent to the first signal line via a first gap, and the first signal line is located to be interposed between the first ground electrode and the second ground electrode to thereby constitute a first coplanar waveguide, and
the first ground electrode extends to be adjacent to the second signal line via a second gap, and the second signal line is located to be interposed between the second ground electrode and the first ground electrode to thereby constitute a second coplanar waveguide.

2. The MEMS switch according to claim 1,
wherein the first flexible member and the second flexible member are arranged in point symmetry in a plan view.

3. An electronic device, comprising:
the MEMS switch according to claim 1,
a signal input element; and
a signal processing element connected to the signal input element via the MEMS switch.

4. A piezoelectric MEMS switch, comprising:
a flexible member including one end portion cantilever-supported by a substrate, and a separation portion thereby separated from the substrate;
a first signal line provided in the flexible member;
a second signal line provided to be separated from the first signal line;
a first pair of grounds provided in the flexible member;
a driving element for deforming the flexible member;
a contact terminal for a signal line that is provided in the flexible member and that switches between electrical connection and disconnection between the first signal line and the second signal line due to deformation of the flexible member by the driving element;
a second pair of grounds provided so that the second pair of grounds are separated from the second signal line and the second signal line is interposed therebetween in a plan view; and
a pair of contact terminals for grounding that switch between electrical connection and disconnection between one of the first pair of grounds and one of the second pair of grounds and between the other of the first pair of grounds and the other of the second pair of grounds due to deformation of the flexible member by the driving element when the contact terminal switches between the electrical connection and the disconnection between the first signal line and the second signal line due to deformation of the flexible member by the driving element, wherein the first pair of grounds are provided so that the first pair of grounds are separated from the first signal line in the separation portion of the flexible member and the first signal line is interposed therebetween in the plan view, at least a portion of the driving element overlaps the first pair of grounds in the separation portion of the flexible member in the plan view, and a timing at which the pair of contact terminals for grounding performs switching from an electrical disconnection state to a connection state between one of the first pair of grounds and one of the second pair of grounds and between the other of the first pair of grounds and the other of the second pair of grounds due to deformation of the flexible member by the driving element is earlier than a timing at which the contact terminal for the signal line performs switching from an electrical disconnection state to a connection state between the first signal line and the second signal line due to deformation of the flexible member by the driving element.

5. A piezoelectric MEMS switch, comprising:
a flexible member including one end portion cantilever-supported by a substrate, and a separation portion thereby separated from the substrate;
a first signal line provided in the flexible member;
a second signal line provided to be separated from the first signal line;
a first pair of grounds provided in the flexible member;
a piezoelectric driving element for deforming the flexible member; and
a contact terminal that is provided in the flexible member and that switches between electrical connection and disconnection between the first signal line and the second signal line due to deformation of the flexible member by the piezoelectric driving element, wherein the first pair of grounds are provided so that the first pair of grounds are separated from the first signal line in the separation portion of the flexible member and the first signal line is interposed therebetween in a plan view, and at least a portion of the piezoelectric driving element overlaps the first pair of grounds in the separation portion of the flexible member in the plan view.

6. The piezoelectric MEMS switch according to claim 5, wherein at least a portion of the first signal line does not overlap the piezoelectric driving element in the separation portion of the flexible member in the plan view.

7. The piezoelectric MEMS switch according to claim 5, wherein, in the separation portion of the flexible member, a distance from each of the pair of grounds to the first signal line is shorter than a distance from the first signal line to the piezoelectric driving element.

8. The piezoelectric MEMS switch according to claim 5, further comprising:
a second pair of grounds provided so that the second pair of grounds are separated from the second signal line and the second signal line is interposed therebetween in the plan view; and
a pair of contact terminals for grounding that switch between electrical connection and disconnection between one of the first pair of grounds and one of the second pair of grounds and between the other of the first pair of grounds and the other of the second pair of grounds due to deformation of the flexible member by the piezoelectric driving element when the contact terminal for a signal line switches between the electrical connection and the disconnection between the first signal line and the second signal line due to deformation of the flexible member by the piezoelectric driving element.

9. The piezoelectric MEMS switch according to claim 5, wherein the first signal line and the first pair of grounds are provided at substantially a same vertical position.

* * * * *